(12) United States Patent
Isobe et al.

(10) Patent No.: US 8,030,193 B2
(45) Date of Patent: Oct. 4, 2011

(54) METHOD OF FABRICATING SEMICONDUCTOR DEVICE

(75) Inventors: Atsuo Isobe, Kanagawa (JP); Suguru Ozawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 839 days.

(21) Appl. No.: 11/955,496

(22) Filed: Dec. 13, 2007

(65) Prior Publication Data

US 2008/0142921 A1 Jun. 19, 2008

(30) Foreign Application Priority Data

Dec. 15, 2006 (JP) ................................. 2006-338012

(51) Int. Cl.
*H01L 21/28* (2006.01)
(52) U.S. Cl. .......... 438/570; 438/571; 257/73; 257/281; 257/284; 257/E21.368
(58) Field of Classification Search .................. 438/570, 438/571; 257/73, 281, 284
See application file for complete search history.

(56) References Cited

U.S. PATENT DOCUMENTS

| 4,566,021 A | 1/1986 | Yokoyama |
| 6,825,105 B2 * | 11/2004 | Grover et al. ................. 438/570 |
| 2005/0133605 A1 | 6/2005 | Koyama et al. |

FOREIGN PATENT DOCUMENTS

| JP | 56-049576 | 5/1981 |
| JP | 57-113289 | 7/1982 |
| JP | 02-178973 | 7/1990 |
| JP | 2002-231969 | 8/2002 |

\* cited by examiner

*Primary Examiner* — Lynne Gurley
*Assistant Examiner* — Samuel Gebremariam
(74) *Attorney, Agent, or Firm* — Nixon Peabody LLP; Jeffrey L. Costellia

(57) ABSTRACT

To fabricate a Schottky barrier diode in which a decrease in on current due to parasitic resistance is suppressed, variations in on current are suppressed, and an increase in off current is suppressed. The fabricating method includes the steps of forming an island-shape semiconductor film; doping the island-shape semiconductor film with a first impurity element to form a first impurity region; forming an insulating film so as to cover the island-shape semiconductor film; etching the insulating film to form a first opening and a second opening that partly expose the first impurity region; forming a mask over the insulating film so as to cover the first opening and expose the second opening; doping the first impurity region with a second impurity element to form a second impurity region; and forming a first wiring in contact with the first impurity region exposed at the first opening, and forming a second wiring in contact with the second impurity region exposed at the second opening. Since the second impurity element is added through the second opening, the periphery of the second opening is also doped with a slight amount of the second impurity element. Therefore, the first impurity region and the second wiring are located away a short distance from each other such that they are not shorted.

12 Claims, 15 Drawing Sheets

700 702 701 704 703 706 708 707

711

712 710

713 713

714 712 715 714

METHOD OF FABRICATING SEMICONDUCTOR DEVICE

BACKGROUND OF THE INVENTION

1. Field of the Invention

The present invention relates to a Schottky barrier diode having an anode and cathode formed on the same plane, and a method of fabricating the Schottky barrier diode.

2. Description of the Related Art

Among conventional methods of fabricating a Schottky barrier diode formed on a semiconductor substrate, there is a method which includes the steps of forming a cathode contact opening region in a silicon oxide film formed on a semiconductor substrate, selectively diffusing or introducing an impurity having the same conductivity type as the semiconductor substrate into the cathode contact opening region by an ion implantation method or the like to form an ohmic contact in a subsequent step, forming an anode contact opening region, forming a metal film on the anode contact opening region to form a Schottky junction, and forming an anode electrode and a cathode electrode (see Japanese Published Patent Application No. H2-178973).

The anode contact opening region and the cathode contact opening region are formed using masks. Therefore, when the two opening regions are positioned a short distance from each other, the anode electrode and the cathode electrode may be shorted due to misalignment of the masks. Thus, it is necessary to provide a given margin between the anode contact opening region and the cathode contact opening region. However, such as margin can be parasitic resistance between the two opening regions, which could result in a decrease in on current of the Schottky barrier diode.

In the case of fabricating a thin film transistor (TFT) and the conventional Schottky barrier diode over the same substrate, there is still a problem of the decrease in on current due to the parasitic resistance of the Schottky barrier diode.

SUMMARY OF THE INVENTION

In the above-described method of fabricating the conventional Schottky barrier diode, the anode contact opening region is formed after the formation of the cathode contact opening region and the formation of the diffusion layer in the cathode region. Therefore, the method involves alignment of the cathode contact opening region and the anode contact opening region. In order to suppress the decrease in on current of the Schottky barrier diode due to the parasitic resistance between the two opening regions, it is necessary to form the cathode contact opening region and the anode contact opening region to be as close as possible to each other. However, in that case, it is difficult to obtain sufficient alignment accuracy.

Further, when the positions of the cathode contact opening region and the anode contact opening region vary among Schottky barrier diodes, on currents of the diodes also vary.

Also, when the anode region and the cathode region overlap with each other, off current of the Schottky barrier diode will increase.

In view of the foregoing, it is an object of the invention to fabricate a Schottky barrier diode in which a cathode region and an anode region are positioned as close as possible to each other, variations in position of the anode region and the cathode region are suppressed, a decrease in on current due to parasitic resistance is suppressed, variations in on current are suppressed, and an increase in off current is suppressed.

The invention relates to a Schottky barrier diode, and it is the gist of the invention to form an anode contact opening region in a cathode region, and form an anode region by counter doping.

A method of fabricating a Schottky barrier diode according to one aspect of the invention includes the steps of: forming an island-shape semiconductor film; doping the island-shape semiconductor film with a first impurity element to form a first impurity region; forming an insulating film so as to cover the island-shape semiconductor film; etching the insulating film to form a first opening and a second opening that partly expose the first impurity region; forming a mask over the insulating film so as to cover the first opening and expose the second opening; doping the first impurity region with a second impurity element to form a second impurity region; and forming a first wiring in contact with the first impurity region that is exposed at the first opening, and forming a second wiring in contact with the second impurity region that is exposed at the second opening.

Since the second impurity element is added through the second opening, the periphery of the second opening is also doped with a slight amount of the second impurity element. Therefore, the first impurity region and the second wiring are located away a short distance from each other such that they are not shorted.

According to the invention, a Schottky barrier diode can be fabricated in which a decrease in on characteristics due to parasitic resistance is suppressed and variations in on characteristics are small.

According to the invention, the cathode electrode and the anode region are located a short distance away from each other such that they are not shorted. Therefore, an increase in off current of the Schottky barrier diode can be suppressed.

DETAILED DESCRIPTION OF THE INVENTION

Hereinafter, embodiment modes and embodiments of the invention will be described with reference to the accompanying drawings. Note that the invention can be implemented in various different ways and it will be easily understood by those skilled in the art that various changes and modifications can be made in the invention without departing from the spirit and scope thereof. Therefore, the invention should not be construed as being limited to the description in the following embodiment modes and embodiments.

Each of Embodiment Modes 1 to 3 described below can be freely combined as appropriate unless departing from the spirit and scope of the invention.

Embodiment Mode 1

Hereinafter, structures of a thin film transistor (TFT) and a Schottky barrier diode, and a method of fabricating them will be described with reference to FIGS. 1A to 1C and 2A to 2D. Cross-sectional views on the left side of FIGS. 1A to 1C and FIGS. 2A to 2D illustrate the steps of fabricating a TFT, whereas cross-sectional views on the right side thereof illustrate the steps of fabricating a Schottky barrier diode.

Figure 1A:
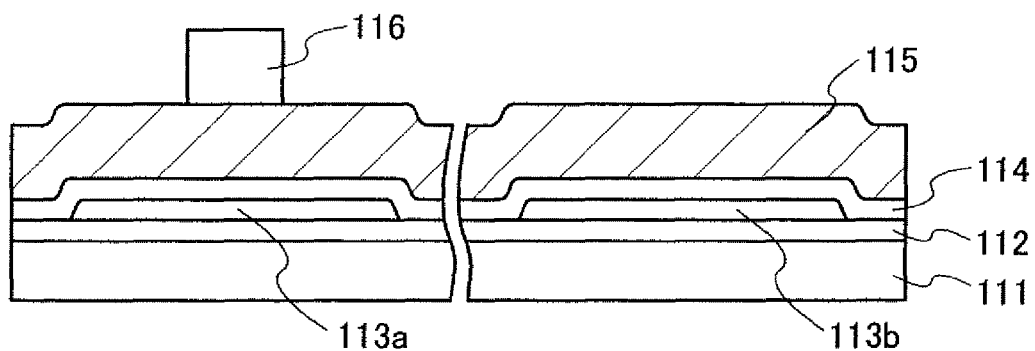
FIGS. 1A to 1C are cross-sectional views illustrating a method of fabricating a semiconductor device in accordance with the invention.

First, a base insulating film 112 is formed to a thickness of 30 to 300 nm over a substrate 111 as illustrated in FIG. 1A. For the substrate 111, an insulating substrate such as a glass substrate, a quartz substrate, a plastic substrate, or a ceramic substrate; a metal substrate; a semiconductor substrate; or the like can be used.

The base insulating film 112 can have either a single-layer structure or a stacked-layer structure of an insulating film containing oxygen or nitrogen, such as silicon oxide ($SiO_x$), silicon nitride ($SiN_x$), silicon oxide containing nitrogen ($SiO_xN_y$, where x>y; also referred to as silicon oxynitride), or silicon nitride containing oxygen ($SiN_xO_y$, where x>y; also referred to as silicon nitride oxide). It is particularly preferable to provide the base insulating film when contaminants from the substrate are concerned. In addition, a film having little fixed charge is preferably used for the base insulating film 112. For example, a $SiO_2$ film formed using a mixed gas of $SiH_4$ and $N_2O$ can be used.

Next, a semiconductor film is formed to a thickness of 10 to 300 nm. A material of the semiconductor film can be selected in accordance with the characteristics required of a TFT. For example, a semiconductor film such as a silicon film or a silicon germanium film can be used. The semiconductor film is preferably a crystalline semiconductor film formed by depositing an amorphous semiconductor film or a microcrystalline semiconductor film and crystallizing the semiconductor film by a laser crystallization method or the like. Deposition of the microcrystalline semiconductor film can be facilitated by using a $SiH_4$ gas or the like that is diluted with hydrogen or a rare gas element such as fluorine. For the laser, a pulsed laser such as an excimer laser or a continuous-wave laser such as a $YVO_4$ laser can be used.

As a crystallization technique, a rapid thermal annealing (RTA) method using a halogen lamp or a crystallization technique using a heating furnace can be used. Further, it is also possible to use a method which includes the steps of adding a metal element such as nickel to an amorphous semiconductor film and solid-phase growing crystals of the semiconductor film with the added metal as a crystalline nucleus.

Next, the semiconductor film is patterned into island-shape semiconductor films 113a and 113b by photolithography and etching steps. Then, a first insulating film 114 is formed to a thickness of 5 to 50 nm so as to cover the island-shape semiconductor films 113a and 113b. The first insulating film is in contact with the island-shape semiconductor films and functions as a gate insulating film.

The first insulating film 114 can be formed in stacked layers by depositing any of silicon oxide ($SiO_x$), silicon nitride ($SiN_x$), silicon oxide containing nitrogen ($SiO_xN_y$, where x>y), and silicon nitride containing oxygen ($SiN_xO_y$, where x>y), by a CVD method, a sputtering method, or the like. Alternatively, the first insulating film 114 can be formed in stacked layers by depositing any of silicon oxide ($SiO_x$), silicon nitride ($SiN_x$), silicon oxide containing nitrogen ($SiO_xN_y$, where x>y), and silicon nitride containing oxygen ($SiN_xO_y$, where x>y), by plasma treatment with high electron density and low electron temperature. In this embodiment mode, the first insulating film 114 is formed with a single layer of a $SiO_xN_y$ film.

Next, a conductive film 115 to serve as an electrode is formed over the first insulating film 114. The conductive film 115 can be formed using an aluminum (Al) film, a copper (Cu) film, a film containing aluminum or copper as a main component, a chromium (Cr) film, a tantalum (Ta) film, a tantalum nitride film, a titanium (Ti) film, a tungsten (W) film, a tungsten nitride film, a molybdenum (Mo) film, or a stacked film of such films, for example, stacked layers of an Al film and a Ta film, stacked layers of an Al film and a Ti film, or stacked layers of a tungsten nitride film and a W film. In this embodiment mode, the conductive film 115 is formed as a stacked film of tantalum nitride with a thickness of 30 nm and tungsten (W) with a thickness of 370 nm.

Next, a mask 116 is formed over the conductive film 115 by a photolithography technique with the use of a photomask. The mask 116 has a shape that partly overlaps with the island-shape semiconductor film 113a to be a TFT, but does not overlap with the island-shape semiconductor film 113b to be a Schottky barrier diode (FIG. 1A).

Figure 1B:
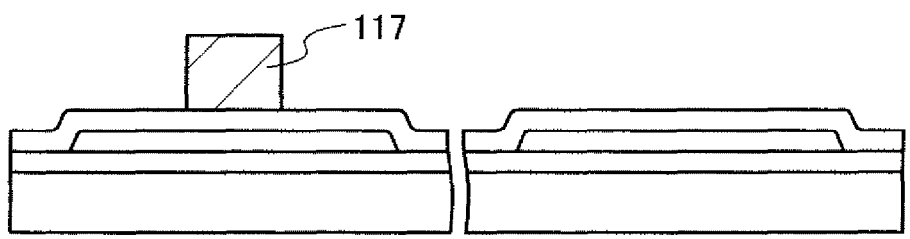
Figure 1C:
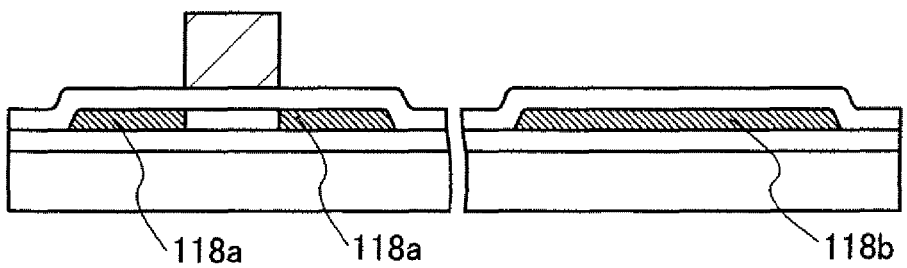

Next, the conductive film 115 is etched using the mask 116, and then the mask 116 is removed. Accordingly, an electrode 117 is formed over the island-shape semiconductor film 113a to be a TFT (FIG. 1B). This electrode 117 functions as a gate electrode.

In this embodiment mode, the conductive film 115, which is a stacked film of tantalum nitride of 30 nm thick and tungsten (W) of 370 nm thick, is etched using the mask 116. In the first etching, etching is preferably conducted with high etch selectivity of tungsten relative to tantalum nitride. In the first etching, a mixed gas of $SF_6$, $Cl_2$, and $O_2$ is used for an etching gas, and a mixture ratio of $SF_6/Cl_2/O_2$ is 33/33/10 sccm. Plasma is generated by supplying a power of 2000 W to a coiled electrode at a pressure of 0.67 Pa. In addition, a power of 50 W is supplied to a substrate side (a sample stage), and the temperature of the sample stage is set at +70° C. Next, the second etching is conducted in which tantalum nitride is etched to form the electrode 117. At this time, etching is preferably conducted with high etch selectivity of tantalum nitride relative to the first insulating film 114 so that the first insulating film 114 is hardly etched. In the second etching, plasma is generated by supplying a power of 2000 W to a coiled electrode at a pressure of 0.67 P, and a power of 50 W is supplied to the substrate (the sample stage). $Cl_2$ is used for an etching gas, and the temperature of the sampling stage is set at +70° C.

Dry etching can be used as the etching in this embodiment mode, and an ICP (inductively coupled plasma) etching apparatus may be used.

Next, the island-shape semiconductor films 113a and 113b are doped with a first impurity element. In this embodiment mode, the island-shape semiconductor films 113a and 113b are doped with an impurity that imparts n-type conductivity or p-type conductivity. The impurity that imparts n-type conductivity or p-type conductivity is added to the island-shape semiconductor films 113a and 113b through the first insulating film 114, with the electrode 117 as a mask. Accordingly, impurity regions 118a and 118b that are first impurity regions are formed. The concentration of the impurity element in the first impurity regions 118a and 118b is $1\times10^{19}$ to $1\times10^{22}$ atoms/cm$^3$ (preferably, $1\times10^{20}$ to $5\times10^{21}$ atoms/cm$^3$). An ion doping method or an ion implantation method may be used as the doping method. For example, in order to impart p-type conductivity to the island-shape semiconductor films 113a and 113b, boron (B), gallium (Ga), or the like can be used as the first impurity element, whereas in order to impart n-type conductivity to the island-shape semiconductor films 113a and 113b, phosphorus (P), arsenic (As), or the like can be used as the first impurity element. In this embodiment mode, in order to form an n-type impurity region in the Schottky barrier diode, the first impurity regions 118a and 118b are doped with phosphorus (P), arsenic (As), or the like that imparts n-type conductivity, as the first impurity element.

Figure 2A:
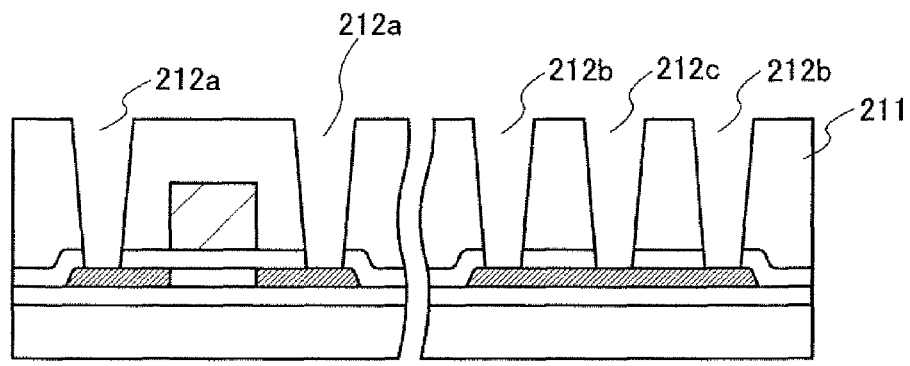
FIGS. 2A to 2D are cross-sectional views illustrating a method of fabricating a semiconductor device in accordance with the invention.

Then, an interlayer insulating film 211 is formed. The interlayer insulating film 211 is formed using an organic material or an inorganic material. The interlayer insulating film 211 may have either a single-layer structure or a stacked-layer structure. Openings 212a to 212c are formed in the interlayer insulating film 211 to partly expose the first impurity regions 118a and 118b (FIG. 2A). The opening 212a is used for connection of source and drain regions of the TFT and wirings; the opening 212b is used for connection of a cathode region of the Schottky barrier diode and a wiring; and the opening 212c is used for connection of an anode region and a wiring. In this embodiment mode, the first impurity regions 118a and 118b are formed as n-type impurity regions. However, when the first impurity regions 118a and 118b are formed as p-type impurity regions, the opening 212b is used for connection of the anode region of the Schottky barrier diode and a wiring, and the opening 212c is used for connection of the cathode region and a wiring.

Note that the impurity in the first impurity regions 118a and 118b may be activated before or after the formation of the interlayer insulating film 211. When the interlayer insulating film 211 is a stacked film, the impurity in the first impurity regions 118a and 118b may be activated after the formation of a part of the interlayer insulating film 211. Activation may be conducted by laser irradiation, RTA, thermal treatment using an electric oven, or the like.

Figure 2B:
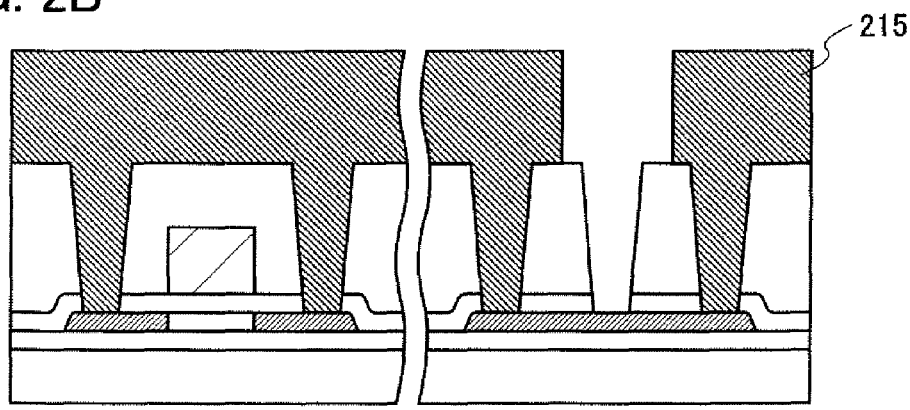
Figure 2C:
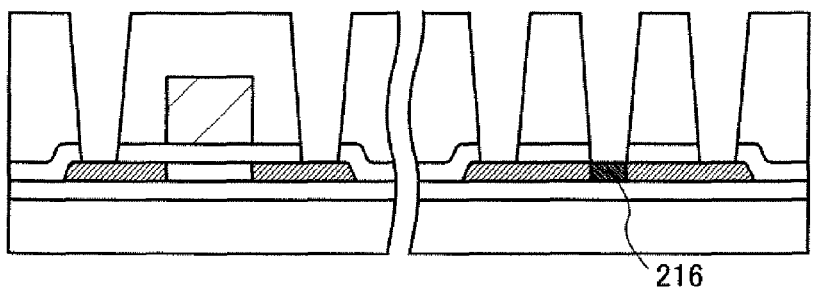

Next, a mask 215 is formed. The mask 215 covers the entire region of the TFT whereas it covers a region other than the opening 212c of the Schottky barrier diode (FIG. 2B).

Next, the first impurity region 118b exposed at the opening 212c is doped with a second impurity element that imparts an opposite conductivity type to the first impurity element which has been added to the first impurity regions 118a and 118b. Accordingly, a second impurity region 216 is formed. In this embodiment mode, boron (B), gallium (Ga), or the like that imparts p-type conductivity is used as the second impurity element added to the second impurity region 216 because phosphorus (P), arsenic (As), or the like that imparts n-type conductivity is used as the first impurity element added to the first impurity regions 118a and 118b. An ion doping method or an ion implantation method may be used as the doping method. Thus, the second impurity element added to the second impurity region 216 is an impurity element that imparts an opposite conductivity type to the first impurity element added to the first impurity regions 118a and 118b. At this time, the second impurity element is added to the extent that the conductivity type of the second impurity region 216 remains unchanged from the conductivity type of the first impurity regions 118a and 118b. The concentration of the second impurity element added to the second impurity region 216 is $1\times10^{18}$ to $1\times10^{21}$ atoms/cm$^3$ (preferably, $1\times10^{19}$ to $5\times10^{20}$ atoms/cm$^3$).

The second impurity region 216 may also be formed by doping the first impurity region 118b exposed at the opening 212c with the second impurity element in order to prevent activation of the first impurity element that has been added to the first impurity regions 118a and 118b. As the second impurity element added to the second impurity region 216, an inert gas such as He or Ar, or a gas that can be combined with Si such as oxygen or nitrogen can be used. The concentration of the second impurity element added to the second impurity region 216 is $1\times10^{18}$ to $1\times10^{21}$ atoms/cm$^3$ preferably, $1\times10^{19}$ to $5\times10^{20}$ atoms/cm$^3$). An ion doping method or an ion implantation method may be used as the doping method.

The concentrations of the first impurity element and the second impurity element added to the second impurity region 216, in a region of 30 nm in depth from the surface, are 0.01 to 100 times (preferably, 0.1 to 10 times) as high as those in the surface of the second impurity region 216.

The concentrations of the impurity elements added to the second impurity region 216 are determined so that the second impurity region 216 can have a sheet resistance value of 10 to 100 kΩ/.

Figure 2D:
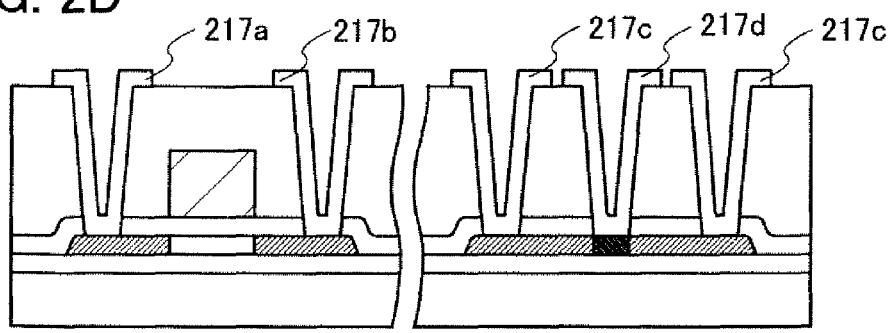

Next, wirings 217a to 217d are formed as illustrated in FIG. 2D. When the second impurity region 216 has n-type conductivity, the work function of the wiring 217d in contact with the second impurity region 216 is preferably 4.4 eV or higher. For example, the wiring 217d may be formed using Ti, W, Pt, or the like. When the wiring 217d is formed of a conductive film having a stacked-layer structure, a metal material of the bottom layer of the wiring 217d that is in contact with the second impurity region 216 should have a work function of 4.4 eV or higher, in order for the wiring 217d to have a work function of 4.4 eV or higher. When the second impurity region 216 has p-type conductivity, the work function of the wiring 217d in contact with the second impurity region 216 is preferably 4.8 eV or lower. For example, the wiring 217d may be formed using Ti or the like. When the wiring 217d is formed of a conductive film having a stacked-layer structure, a metal material of the bottom layer of the wiring 217d that is in contact with the second impurity region 216 should have a work function of 4.8 eV or lower, in order for the wiring 217d to have a work function of 4.8 eV or lower. When the wirings 217a to 217d formed with only the above-mentioned material have high wiring resistance, they may have a stacked-layer structure. For example, a stacked-layer structure in which Ti, Al, and Ti are sequentially formed or a stacked-layer structure in which Ti, titanium nitride, Al, and Ti are sequentially formed may be used.

Figure 3A:
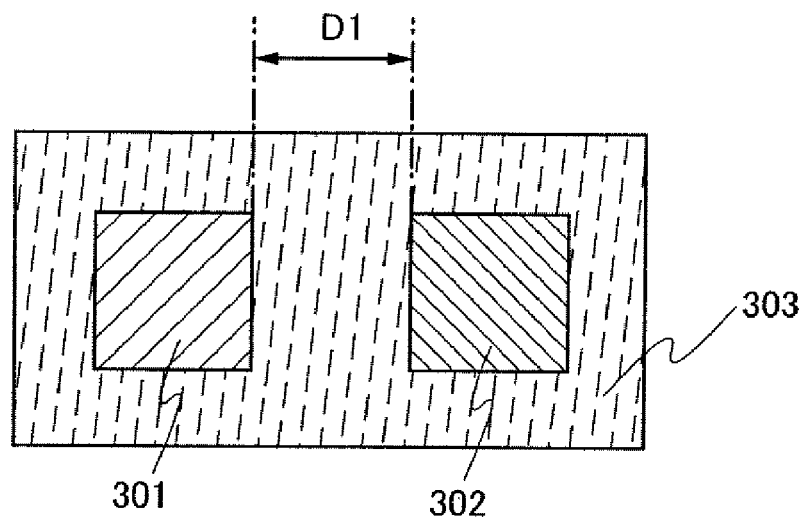
FIGS. 3A and 3B are top views illustrating the structures of Schottky barrier diodes whose current vs. voltage characteristics are measured as in FIG. 9.
Figure 3B:
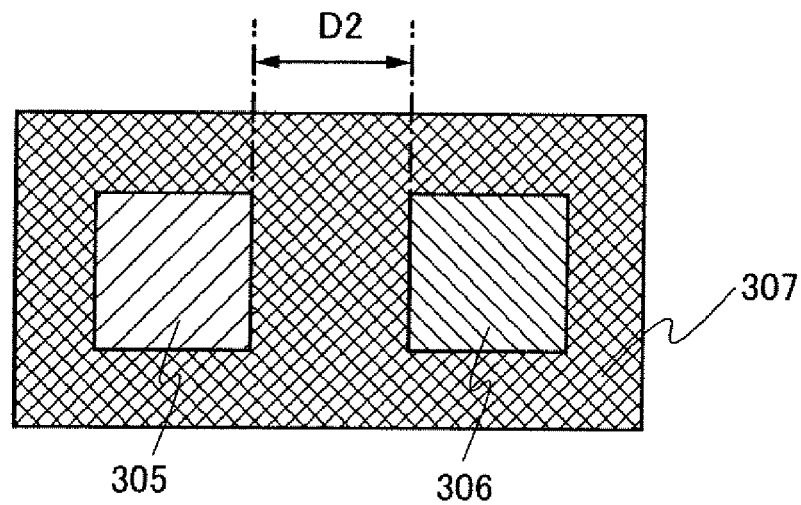

Next, logical calculation results are shown, which demonstrate the structure in accordance with this embodiment mode can increase the on characteristics of a Schottky barrier diode. Calculation was conducted using TCAD software, Sentaurus (manufactured by Synopsys, Inc.). FIGS. 3A and 3B are top views illustrating the structures of Schottky barrier diodes that are used for logical calculation.

FIG. 3A illustrates the structure in accordance with this embodiment mode, in which impurity regions 301 and 303 are the first impurity regions doped with only the first impurity element, whereas an impurity region 302 is the second impurity region doped with the first impurity element and the second impurity element. The first impurity region 301 is connected to and forms an ohmic contact with a first wiring. The impurity region 302 is connected to a second wiring to form a Schottky barrier diode. The impurity region 303 has the same sheet resistance value as the impurity region 301 but has a lower sheet resistance value than the impurity region 302.

FIG. 3B illustrates the structure of a Schottky barrier diode of a comparative example of this embodiment mode, in which impurity regions 306 and 307 are regions doped with only the first impurity element, whereas an impurity region 305 is a region doped with the first impurity element and the second impurity element. The impurity region 305 is connected to and forms an ohmic contact with a first wiring. The impurity region 306 is connected to a second wiring to form a Schottky barrier diode. The impurity region 307 has the same sheet resistance value as the impurity region 306 but has a higher sheet resistance value than the impurity region 305.

Figure 9:
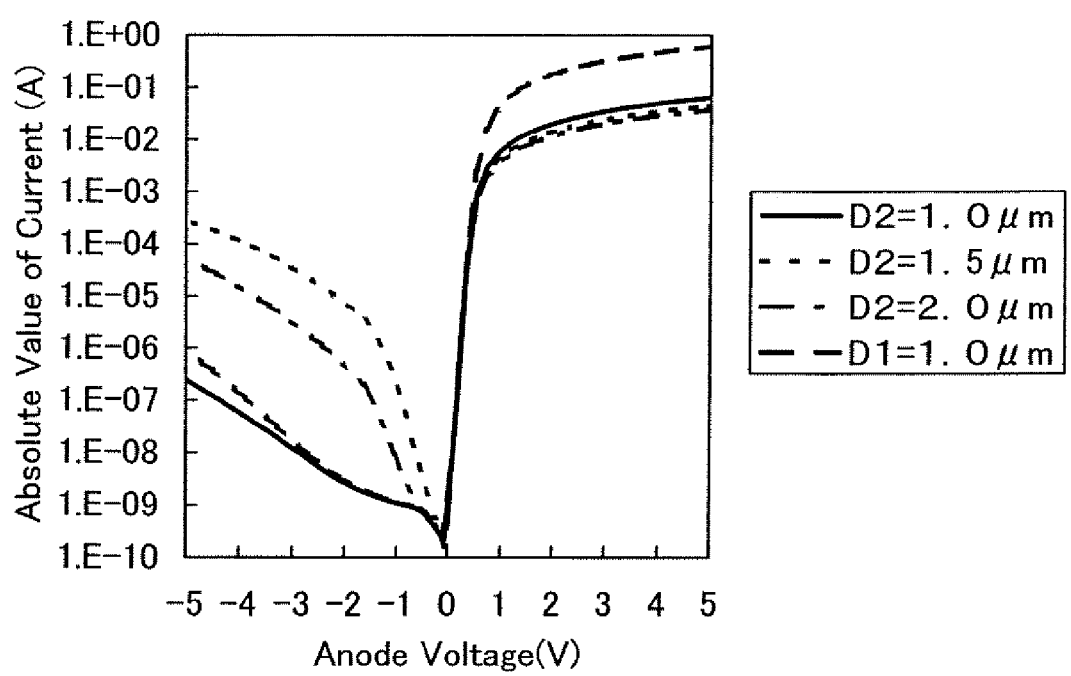
FIG. 9 is a graph illustrating the current vs. voltage characteristics of Schottky barrier diodes of Embodiment Mode 1 and a comparative example of the invention.

FIG. 9 shows calculation results of the current vs. voltage characteristics of the Schottky barrier diodes, for cases where the distance $D_1$ between the impurity region 301 and the impurity region 302 in FIG. 3A is 1.0 µm, and the distance $D_2$ between the impurity region 305 and the impurity region 306 in FIG. 3B is 1.0 µm, 1.5 µm, and 2.0 µm. The results in FIG. 9 show that the structure of FIG. 3A, that is the structure of this embodiment mode has the lowest decreasing rate of on characteristics. Also, FIG. 9 shows that the decreasing rate of on characteristics is lower as the distance $D_2$ between the impurity region 305 and the impurity region 306 is shorter. Since the structure of FIG. 3A, that is the structure of this embodiment mode has a low decreasing rate of on characteristics, it has small variations in on characteristics.

The above results show that a Schottky barrier diode fabricated in accordance with this embodiment mode can have a suppressed decreasing rate of on characteristics and, thus, variations in on characteristics can be suppressed.

Embodiment Mode 2

Hereinafter, structures of a complementary thin film transistor (TFT) and a Schottky barrier diode, and a method of fabricating them will be described with reference to FIGS. 4A to 5D. Cross-sectional views on the left side of FIGS. 4A to 4D and FIGS. 5A to 5D illustrate the steps of fabricating a TFT, whereas cross-sectional views on the right side thereof illustrate the steps of fabricating a Schottky barrier diode.

Figure 4A:
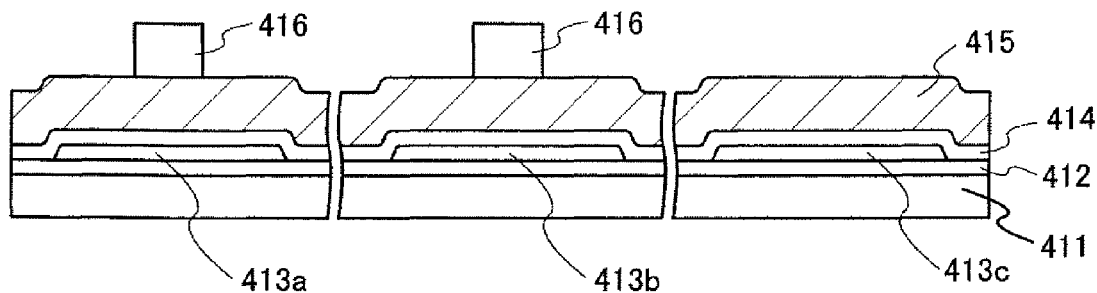
FIGS. 4A to 4D are cross-sectional views illustrating a method of fabricating a semiconductor device in accordance with the invention.

First, as illustrated in FIG. 4A, a base insulating film 412 is formed to a thickness of 30 to 300 nm over a substrate 411. For the substrate 411, an insulating substrate such as a glass substrate, a quartz substrate, a plastic substrate, or a ceramic substrate; a metal substrate; a semiconductor substrate; or the like can be used.

The base insulating film 412 can have either a single-layer structure or a stacked-layer structure of an insulating film containing oxygen or nitrogen, such as silicon oxide ($SiO_x$), silicon nitride ($SiN_x$), silicon oxide containing nitrogen ($SiO_xN_y$, where x>y; also referred to as silicon oxynitride), or silicon nitride containing oxygen ($SiN_xO_y$, where x>y; also referred to as silicon nitride oxide). It is particularly preferable to provide the base insulating film when contaminants from the substrate are concerned. In addition, a film having little fixed charge is preferably used for the base insulating film 412. For example, a $SiO_2$ film formed using a mixed gas of $SiH_4$ and $N_2O$ can be used.

Next, a semiconductor film is formed to a thickness of 10 to 300 nm. A material of the semiconductor film can be selected in accordance with the characteristics required of a TFT. For example, a semiconductor film such as a silicon film or a silicon germanium film can be used. The semiconductor film is preferably a crystalline semiconductor film formed by depositing an amorphous semiconductor film or a microcrystalline semiconductor film and crystallizing the semiconductor film by a laser crystallization method or the like. Deposition of the microcrystalline semiconductor film can be facilitated by using a $SiH_4$ gas or the like that is diluted with hydrogen or a rare gas element such as fluorine. For the laser, a pulsed laser such as an excimer laser or a continuous-wave laser such as a $YVO_4$ laser can be used.

As a crystallization technique, a rapid thermal annealing (RTA) method using a halogen lamp or a crystallization technique using a heating furnace can be used. Further, it is also possible to use a method which includes the steps of adding a metal element such as nickel to an amorphous semiconductor film and solid-phase growing crystals of the semiconductor film with the added metal as a crystalline nucleus.

Next, the semiconductor film is patterned into island-shape semiconductor films 413a to 413c by photolithography and etching steps. Then, a first insulating film 414 is formed to a thickness of 5 to 50 nm so as to cover the island-shape semiconductor films 413a to 413c. The first insulating film is in contact with the island-shape semiconductor films and functions as a gate insulating film.

The first insulating film 414 can be formed in stacked layers by depositing any of silicon oxide ($SiO_x$), silicon nitride ($SiN_x$), silicon oxide containing nitrogen ($SiO_xN_y$, where x>y), and silicon nitride containing oxygen ($SiN_xO_y$, where x>y), by a CVD method, a sputtering method, or the like. Alternatively, the first insulating film 414 can be formed in stacked layers by depositing any of silicon oxide ($SiO_x$), silicon nitride ($SiN_x$), silicon oxide containing nitrogen ($SiO_xN_y$, where x>y), and silicon nitride containing oxygen ($SiN_xO_y$, where x>y), by plasma treatment with high electron density and low electron temperature. In this embodiment mode, the first insulating film 414 is formed with a single layer of a $SiO_xN_y$ film.

Next, a conductive film 415 to serve as an electrode is formed over the first insulating film 414. The conductive film 415 can be formed using an aluminum (Al) film, a copper (Cu) film, a film containing aluminum or copper as a main component, a chromium (Cr) film, a tantalum (Ta) film, a tantalum nitride film, a titanium (Ti) film, a tungsten (W) film, a tungsten nitride film, a molybdenum (Mo) film, or a stacked film of such films, for example, stacked layers of an Al film and a Ta film, stacked layers of an Al film and a Ti film, or stacked layers of a tantalum nitride film and a W film. In this embodiment mode, the conductive film 415 is formed as a stacked film of tantalum nitride with a thickness of 30 nm and tungsten (W) with a thickness of 370 nm.

Next, masks 416 are formed over the conductive film 415 by a photolithography technique with the use of photomasks. Each mask 416 has a shape that partly overlaps with the island-shape semiconductor film 413a or 413b to be a TFT, but does not overlap with the island-shape semiconductor film 413c to be a Schottky barrier diode (FIG. 4A).

Figure 4B:
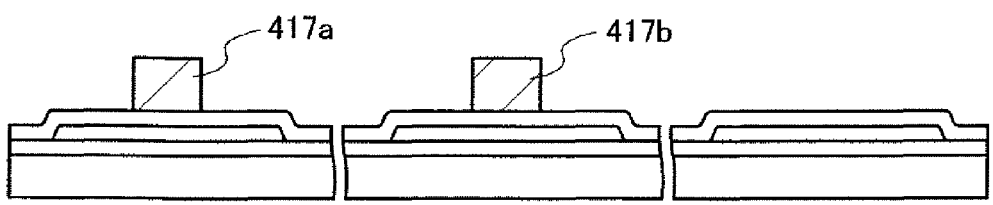
Figure 4C:
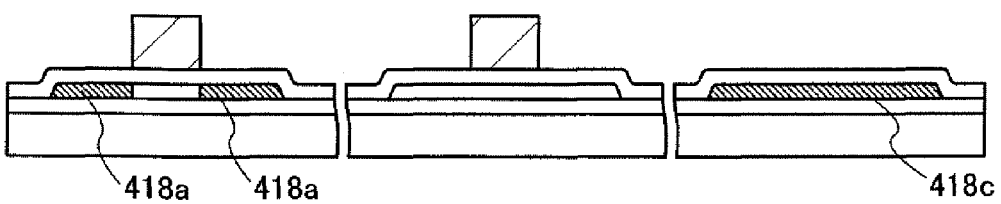
Figure 4D:
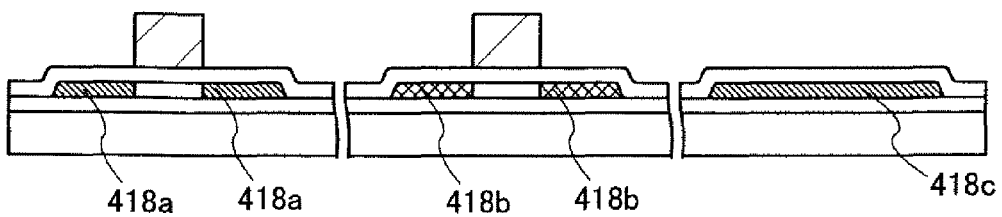

Next, the conductive film 415 is etched using the masks 416, and then the masks 416 are removed. Accordingly, electrodes 417a and 417b are formed over the island-shape semiconductor films 413a and 413b to be TFTs (FIG. 4B). These electrodes 417a and 417b function as gate electrodes. In this step, the conductive film 415 formed over the island-shape semiconductor film 413c to be a Schottky barrier diode is totally removed by etching (FIG. 4B).

Next, the island-shape semiconductor films 413a and 413c are doped with a first impurity element. In this embodiment mode, the island-shape semiconductor films 413a and 413c are doped with an impurity that imparts n-type conductivity or p-type conductivity. The first impurity element that imparts n-type conductivity or p-type conductivity is added to the island-shape semiconductor films 413a and 413c through the first insulating film 414, with the electrodes 417a as a mask. Accordingly, first impurity regions 418a and 418c are formed. At the time, a mask is formed over the island-shape semiconductor film 413b in advance to prevent the first impurity element from being added into the island-shape semiconductor film 413b. Then, the mask is removed after the first impurity regions 418a and 418c are formed. The concentration of the impurity element in the first impurity regions 418a and 418c is $1\times10^{19}$ to $1\times10^{22}$ atoms/cm$^3$ (preferably, $1\times10^{20}$ to $5\times10^{21}$ atoms/cm$^3$). An ion doping method or an ion implantation method may be used as the doping method. For example, in order to impart p-type conductivity to the island-shape semiconductor films 413a and 413c, boron (B), gallium (Ga), or the like can be used as the first impurity element, whereas in order to impart n-type conductivity to the island-shape semiconductor films 413a and 413c, phosphorus (P), arsenic (As), or the like can be used as the first impurity element. In this embodiment mode, in order to form an n-type impurity region in the island-shape semiconductor film 413C to be a Schottky barrier diode, the first impurity regions 418a and 418c are doped with phosphorus (P), arsenic (As), or the like that imparts n-type conductivity, as the first impurity element.

Next, the island-shape semiconductor film 413b is doped with a second impurity element. In this embodiment mode, the island-shape semiconductor film 413b is doped with an impurity that imparts an opposite conductivity type to the impurity which has been added to the island-shape semiconductor films 413a and 413c. The second impurity that imparts n-type conductivity or p-type conductivity is added to the island-shape semiconductor film 413b through the first insulating film 414, with the electrode 417b as a mask. Accordingly, second impurity regions 418b are formed. At the time, a mask is formed over the island-shape semiconductor films 413a and 413c in advance to prevent the second impurity element from being added into the island-shape semiconductor films 413a and 413c. Then, the mask is removed after the second impurity region 418b is formed. The concentration of the impurity element in the second impurity regions 418b is $1\times10^{19}$ to $1\times10^{22}$ atoms/cm$^3$ (preferably, $1\times10^{20}$ to $5\times10^{21}$ atoms/cm$^3$). An ion doping method or an ion implantation method may be used as the doping method. For example, in order to impart p-type conductivity to the island-shape semiconductor film 413b, boron (B), gallium (Ga), or the like can be used as the second impurity element, whereas in order to impart n-type conductivity to the island-shape semiconductor film 413b, phosphorus (P), arsenic (As), or the like can be used as the second impurity element. In this embodiment mode, boron (B), gallium (Ga), or the like that imparts p-type conductivity is used for the second impurity regions 418b.

Figure 5A:
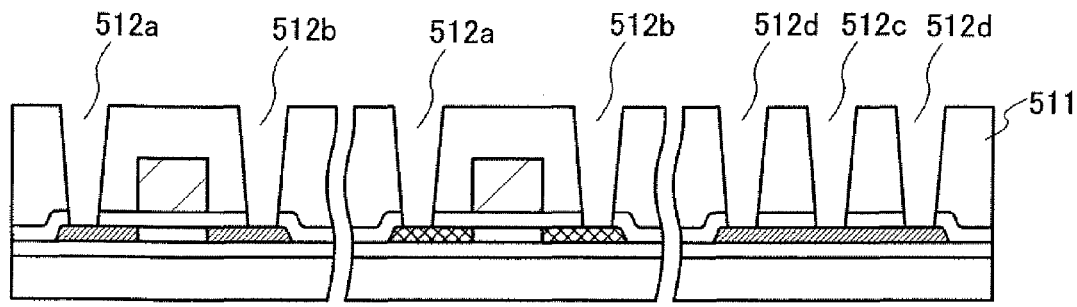
FIGS. 5A to 5D are cross-sectional views illustrating a method of fabricating a semiconductor device in accordance with the invention.

Then, an interlayer insulating film 511 is formed. The interlayer insulating film 511 is formed using an organic material or an inorganic material. The interlayer insulating film 511 may have either a single-layer structure or a stacked-layer structure. Openings 512a to 512d are formed in the interlayer insulating film 511 to partly expose the first impurity regions 418a and 418c and the second impurity regions 418b (FIG. 5A). The openings 512a and 512b are used for connection of source and drain regions of the TFTs and wirings; the opening 512c is used for connection of a cathode region of the Schottky barrier diode and a wiring; and the opening 512d is used for connection of an anode region and a wiring. In this embodiment mode, the first impurity region 418c is formed as an n-type impurity region. However, when the first impurity region 418c is formed as a p-type impurity region, the opening 512c is used for connection of the anode region of the Schottky barrier diode and a wiring, and the opening 512d is used for connection of the cathode region and a wiring.

Note that the impurities in the first impurity regions 418a and 418c and the second impurity regions 418b may be activated before or after the formation of the interlayer insulating film 511. When the interlayer insulating film 511 is a stacked film, the impurities in the first impurity regions 418a and 418c and the second impurity regions 418b may be activated after the formation of a part of the interlayer insulating film 511. Activation may be conducted by laser irradiation, RTA, thermal treatment using an electric oven, or the like.

Figure 5B:
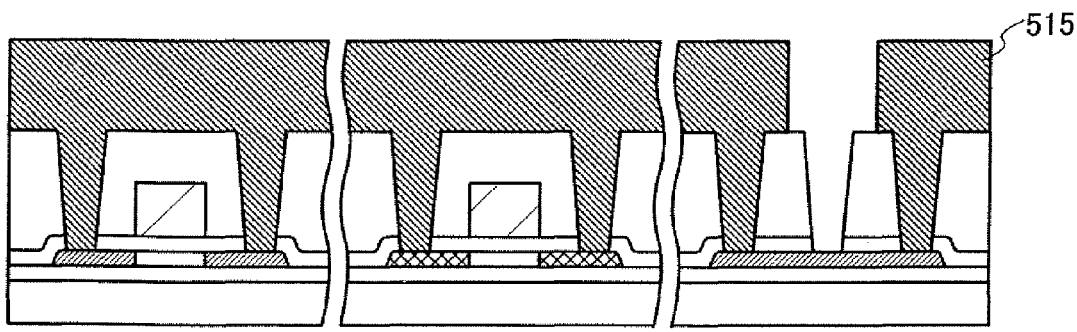
Figure 5C:
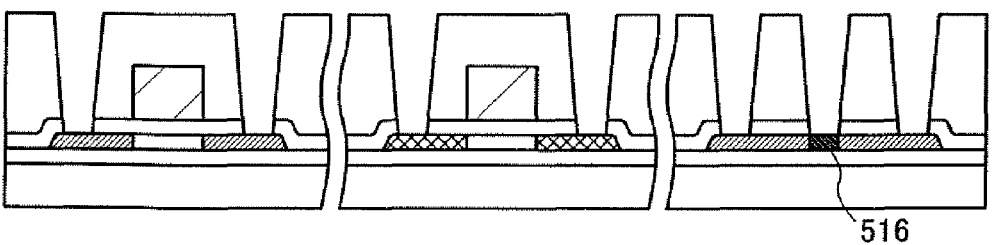

Next, a mask 515 is formed. The mask 515 covers the entire region of the TFT whereas it covers a region other than the opening 512c of the Schottky barrier diode (FIG. 5B).

Next, the first impurity region 418c exposed at the opening 512c is doped with a third impurity element that imparts an opposite conductivity type to the first impurity element which has been added to the first impurity regions 418a and 418c. Accordingly, a third impurity region 516 is formed. In this embodiment mode, boron (B), gallium (Ga), or the like that imparts p-type conductivity is used as the third impurity element added to the third impurity region 516 because phosphorus (P), arsenic (As), or the like that imparts n-type conductivity is used as the first impurity element added to the first impurity regions 418a and 418c. An ion doping method or an ion implantation method may be used as the doping method. Thus, the third impurity element added to the third impurity region 516 is an impurity element that imparts an opposite conductivity type to the first impurity element added to the first impurity regions 418a and 418c. At this time, the third impurity element is added to the extent that the conductivity type of the third impurity region 516 remains unchanged from the conductivity type of the first impurity regions 418a and 418c. The concentration of the third impurity element added to the third impurity region 516 is $1\times10^{18}$ to $1\times10^{21}$ atoms/cm$^3$ (preferably, $1\times10^{19}$ to $5\times10^{20}$ atoms/cm$^3$).

The third impurity region 516 may also be formed by doping the first impurity region 418c exposed at the opening 512c with the third impurity element in order to prevent activation of the first impurity element that has been added to the first impurity regions 418a and 418c. As the third impurity element added to the third impurity region 516, an inert gas such as He or Ar, or a gas that can be combined with Si, such as oxygen or nitrogen can be used. The concentration of the third impurity element added to the third impurity region 516 is $1\times10^{18}$ to $1\times10^{21}$ atoms/cm$^3$ (preferably, $1\times10^{19}$ to $5\times10^{21}$ atoms/cm$^3$). An ion doping method or an ion implantation method may be used as the doping method.

The concentrations of the first impurity element and the third impurity element added to the third impurity region 516, in a region of 30 nm in depth from the surface, are 0.01 to 100 times (preferably, 0.1 to 10 times) as high as those in the surface of the third impurity region 516.

The concentrations of the impurity elements added to the third impurity region 516 are determined so that the third impurity region 516 can have a sheet resistance value of 10 to 100 kΩ/.

Figure 5D:
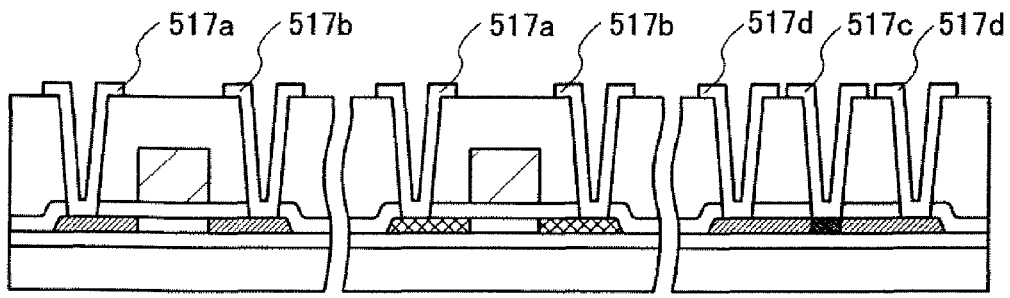

Next, wirings 517a to 517d are formed as illustrated in FIG. 5D. When the third impurity region 516 has n-type conductivity, the work function of the wiring 517c in contact with the third impurity region 516 is preferably 4.4 eV or higher. For example, the wiring 517c may be formed using Ti, W, Pt, or the like. When the wiring 517c is formed of a conductive film having a stacked-layer structure, a metal material of the bottom layer of the wiring 517c that is in contact with the third impurity region 516 should have a work function of 4.4 eV or higher, in order for the wiring 517c to have a work function of 4.4 eV or higher. When the third impurity region 516 has p-type conductivity, the work function of the wiring 517c in contact with the third impurity region 516 is preferably 4.8 eV or lower. For example, the wiring 517c may be formed using Ti or the like. When the wiring 517c is formed of a conductive film having a stacked-layer structure, a metal material of the bottom layer of the wiring 517c that is in contact with the third impurity region 516 should have a work function of 4.8 eV or lower, in order for the wiring 517c to have a work function of 4.8 eV or lower. When the wirings 517a to 517d formed with only the above-mentioned material have high wiring resistance, they may have a stacked-layer structure. For example, a stacked-layer structure in which Ti, Al, and Ti are sequentially formed or a stacked-layer structure in which Ti, titanium nitride, Al, and Ti are sequentially formed may be used.

Accordingly, the parasitic resistance of a Schottky barrier diode fabricated in accordance with this embodiment mode is suppressed to the minimum, and the on characteristics of such a Schottky barrier diode are excellent. In addition, the Schottky barrier diode can be formed concurrently with a complementary thin film transistor (TFT).

Embodiment Mode 3

Figure 6:
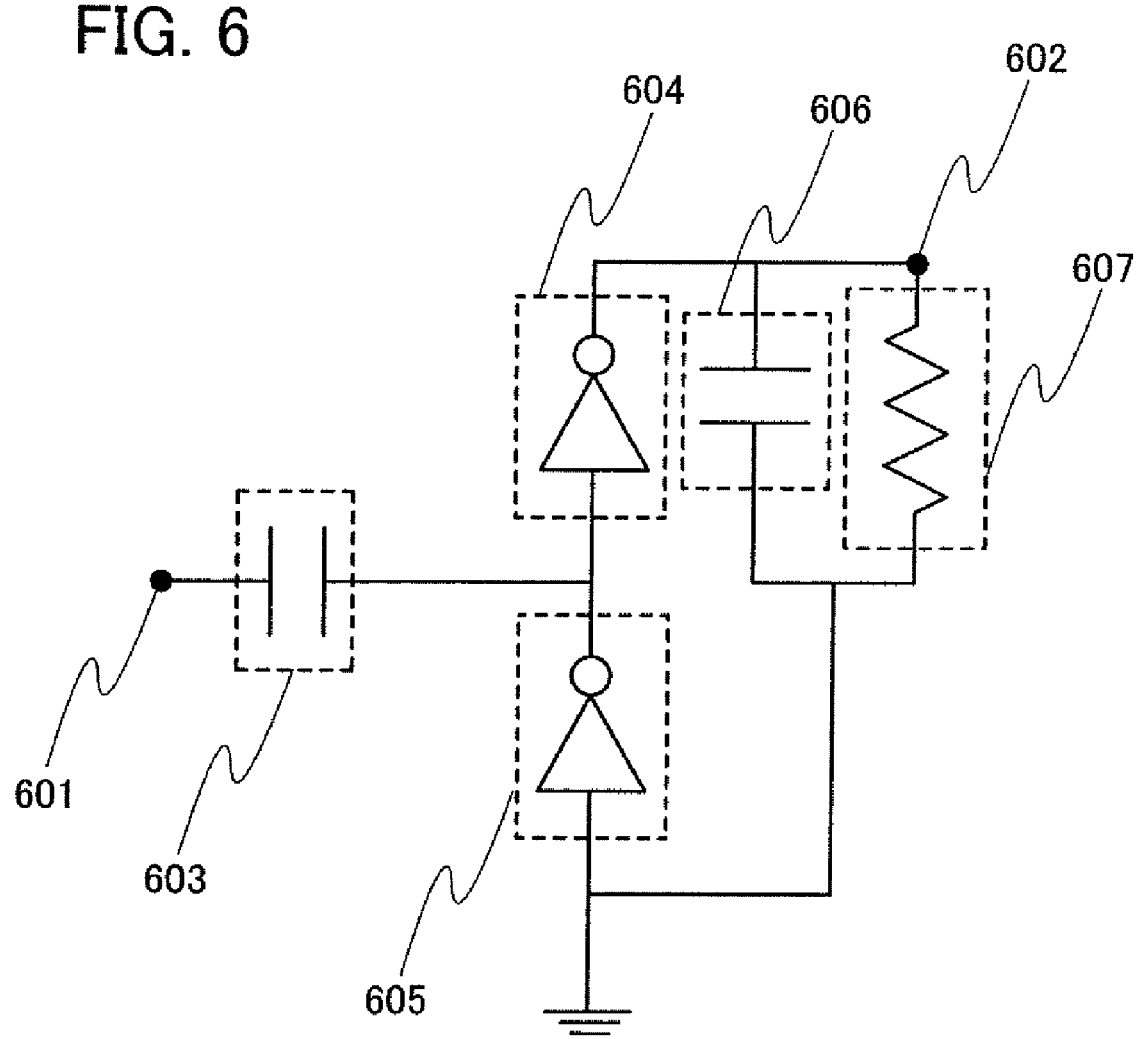
FIG. 6 is a circuit diagram of a rectifier circuit of the invention.
Figure 7A:
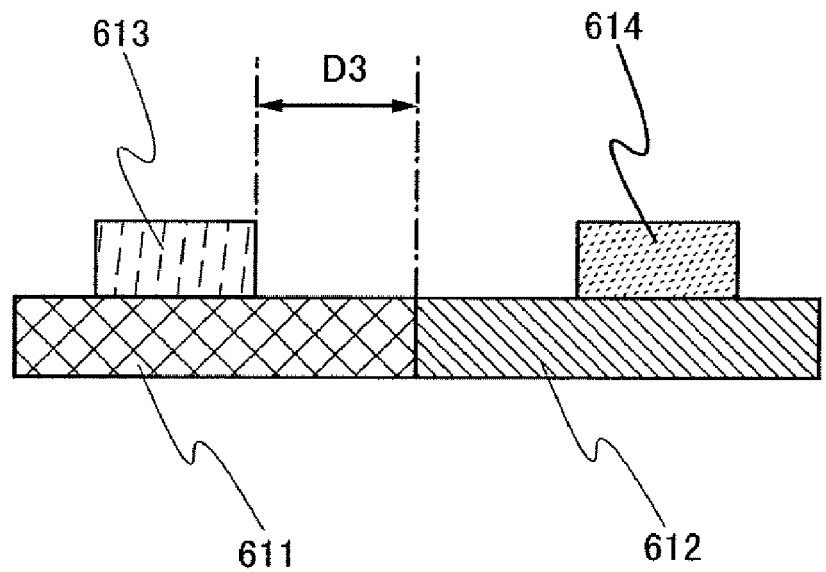
FIGS. 7A and 7B each illustrate the structure of the invention.
Figure 7B:
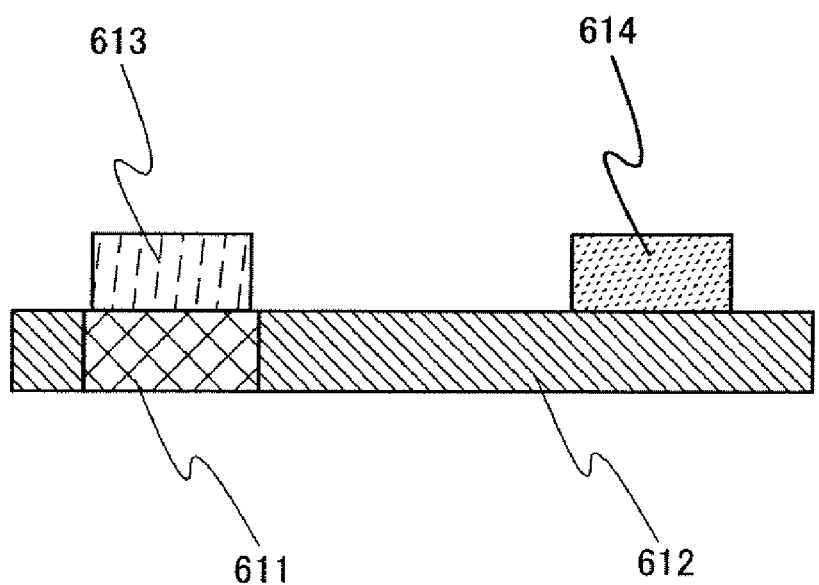
Figure 8A:
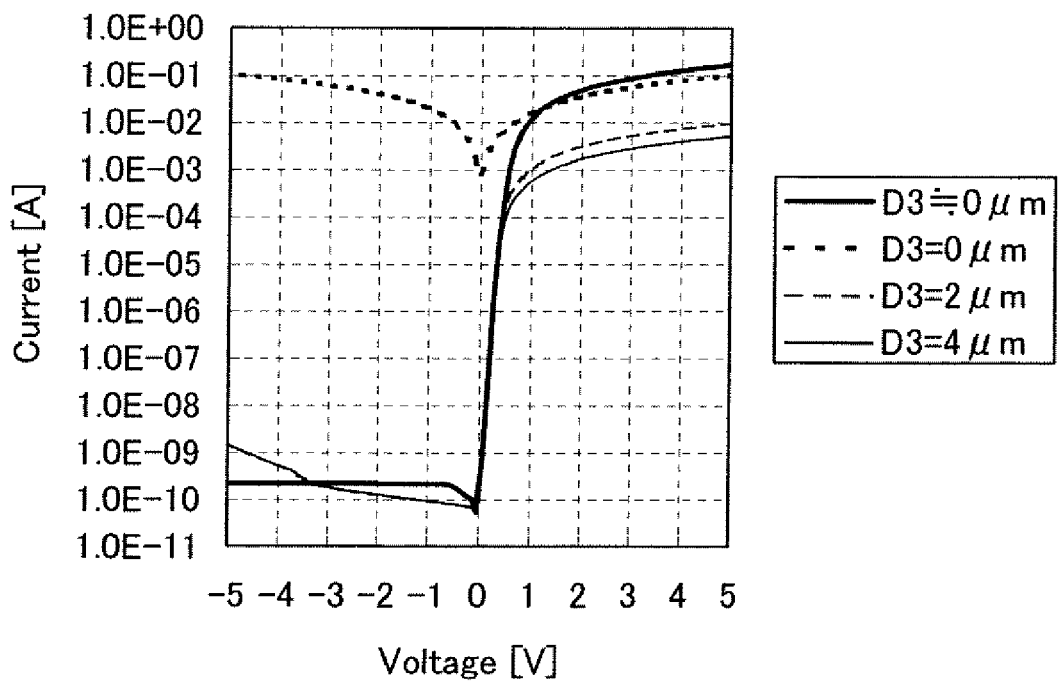
FIG. 8A is a graph illustrating the current vs. voltage characteristics of Schottky barrier diodes.
Figure 8B:
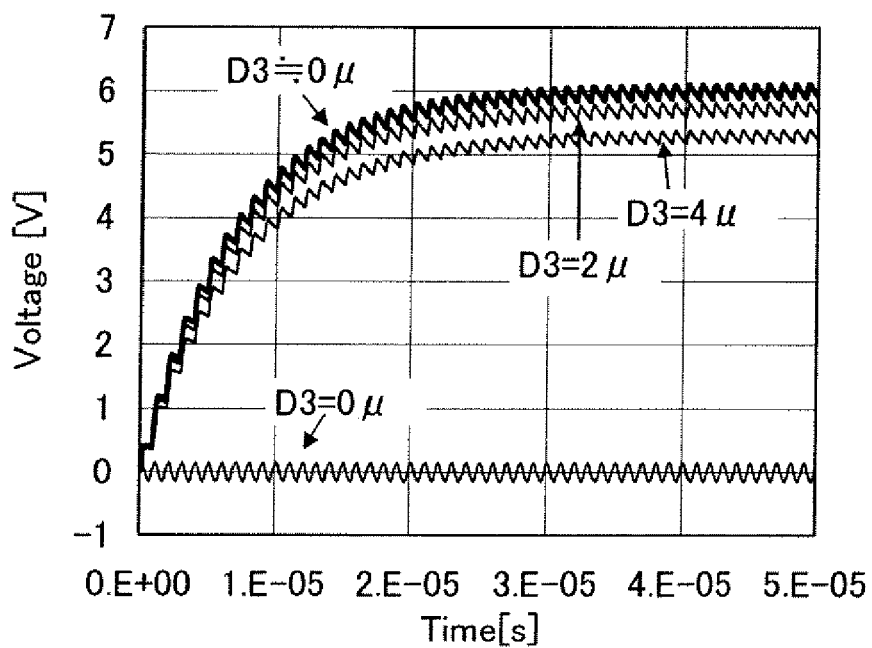
FIG. 8B is a graph illustrating the rectification properties of rectifier circuits for which the Schottky barrier diodes are used.

This embodiment mode will describe a rectifier circuit using a Schottky barrier diode, with reference to FIGS. 6, 7A, 7B, 8A, and 8B. FIG. 6 is a circuit diagram of a rectifier circuit. FIGS. 7A and 7B illustrate the element structures of Schottky barrier diodes. FIG. 8A illustrates the current vs. voltage characteristics of the Schottky barrier diodes, and FIG. 8B illustrates the rectification properties of rectifier circuits to which the Schottky barrier diodes are applied.

Hereinafter, logical calculation results are shown, which demonstrate that the structures of the Schottky barrier diodes in accordance with Embodiment Modes 1 and 2 can improve the output voltage characteristics of a rectifier circuit. First, a rectifier circuit in FIG. 6 is described. A terminal 601 is a signal input terminal and a terminal 602 is a terminal that outputs a voltage generated by rectification with the rectifier circuit. A Schottky barrier diode 604 is connected in a forward direction to an output terminal of a capacitor 603. The capacitor 603 is connected to an anode electrode of the Schottky barrier diode 604, and one of terminals of a capacitor 606 and a resistor 607 are connected to a cathode electrode of the Schottky barrier diode 604 such that the capacitor 606, the resistor 607, and the Schottky barrier diode 604 are connected in parallel. The other terminals of the capacitor 606 and the resistor 607 are connected to the ground. In addition, a cathode electrode of a Schottky barrier diode 605 is connected between the capacitor 603 and the anode electrode of the Schottky barrier diode 604, and an anode electrode of the Schottky barrier diode 605 is connected to the ground.

FIGS. 7A and 7B illustrate the element structures of Schottky barrier diodes that are used for calculation of the rectification property of the rectifier circuit in FIG. 6. In FIG. 7A, an impurity region 611 and an electrode 613 form a Schottky junction, and an impurity region 612 and an electrode 614 form an ohmic contact A distance 93 represents the distance between the impurity region 612 and the electrode 613. FIG. 7B illustrates the element structure of a Schottky barrier diode in accordance with Embodiment Mode 1. The impurity region 612 corresponds to the first impurity region in Embodiment Mode 1, and the impurity region 611 corresponds to the second impurity region in Embodiment Mode 1. The impurity region 611 is formed to be slightly wider than the electrode 613.

FIG. 8A shows calculation results of the current-voltage characteristics of the Schottky barrier diode in FIG. 7A for cases where the distance $D_3$ between the impurity region 612 and the electrode 613 is 4 μm, 2 μm, and 0 μm, and the current-voltage characteristics of the Schottky barrier diode in FIG. 7B in which the distance between the impurity region 612 and the electrode 613 is very short. That is, the Schottky barrier diode in FIG. 7B has a structure in accordance with Embodiment Mode 1, and the calculation was conducted with the condition that $D_3 \neq 0$ and $D_3 \approx 0$, using TCAD software, Sentaurus (manufactured by Synopsys, Inc.).

FIG. 8B shows changes in voltage over time of the terminal 602 of the rectifier circuit illustrated in FIG. 6. The changes in voltage over time of the terminal 602 of the rectifier circuit are calculated for the case where each of the Schottky barrier diodes 604 and 605 has the current-voltage characteristics illustrated in FIG. 8A. Specifically, calculated are the changes in voltage over time of the terminal 602 when a 1 MHz AC (alternating current) signal with an amplitude of ±5 V is input to the terminal 601. For calculation, TCAD software, Sentaurus (manufactured by Synopsys, Inc.) is used. FIG. 8B shows that the output voltage of the terminal 602 is the highest in the structure in accordance with Embodiment Mode 1. These results can confirm that the voltage of the terminal 602 is higher as the on characteristics of the Schottky battier diode are higher.

As described above, a rectifier circuit having the Schottky barrier diode with excellent on characteristics, which is fabricated in accordance with Embodiment Mode 1 or 2, can generate high voltage and can perform rectification with high efficiency.

As described above, a semiconductor device fabricated in accordance with the invention can obtain excellent characteristics. Further, when the semiconductor device fabricated in accordance with the invention is applied to various thin film integrated circuits and the like, a higher function and higher added value can be achieved.

Embodiment 1

Figure 10:
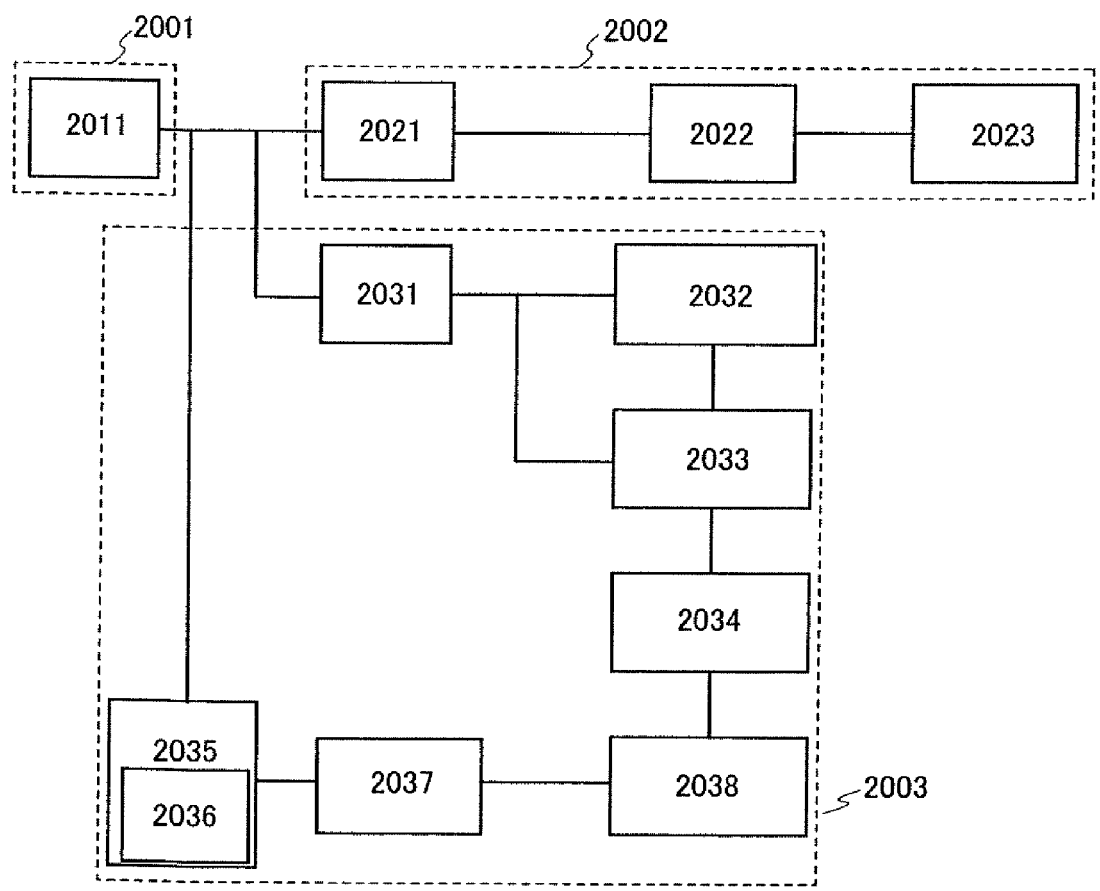
FIG. 10 is a block diagram illustrating an exemplary configuration of a semiconductor device of the invention which is capable of wireless data transmission.

This embodiment will describe a semiconductor device that has a rectifier circuit using the Schottky barrier diode of the invention. The semiconductor device in this embodiment is a semiconductor device capable of wireless data transmission. FIG. 10 is a block diagram illustrating an exemplary configuration of a semiconductor device. The semiconductor device of this embodiment mode includes an antenna section 2001, a power supply section 2002, and a logic section 2003 as its main components.

The antenna section 2001 includes an antenna 2011 that receives external signals and transmits data. The signal transmission method of the semiconductor device can be an electromagnetic coupling method, an electromagnetic induction method, a microwave method, or the like. The transmission method may be selected as appropriate taking an intended use of the device into account, and an antenna that is suitable for the transmission method may be provided.

The power supply section 2002 includes a rectifier circuit 2021 that produces power based on a signal received from the outside through the antenna 2011, a storage capacitor 2022 for storing the produced power, and a constant voltage circuit 2023 for generating a constant voltage to be supplied to each circuit. The rectifier circuit in Embodiment Mode 3 is used for the rectifier circuit 2021. FIG. 6 corresponds to an equivalent circuit diagram of the rectifier circuit 2021.

The logic section 2003 includes a demodulation circuit 2031 that demodulates received signals, a clock generating/compensating circuit 2032 that generates clock signals, a code recognition and determination circuit 2033, a memory controller 2034 that produces a signal for reading data from a memory based on a received signal, a modulation circuit 2035 for modulating an encoded signal to be transmitted, an encoder circuit 2037 that encodes the read data, and a mask ROM 2038 that stores data. Further, the modulation circuit 2035 has a resistor 2036 for modulation.

A code recognized and determined by the code recognition and determination circuit 2033 is a frame termination signal (EOF, End of Frame), a frame starting signal (SOF, Start of Frame), a flag, a command code, a mask length, a mask value, or the like. The code recognition and determination circuit 2033 also has a cyclic redundancy check (CRC) function for detecting transmission errors.

Next, a fabrication process of the semiconductor device capable of wireless data transmission will be described with reference to FIGS. 11A to 11E, 12A to 12D, 13A to 13C, and 14A to 14D. The semiconductor device of this embodiment is a flexible device. Therefore, the semiconductor device is formed by transferring a circuit to a flexible substrate from a substrate that is used in the fabrication process.

Figure 11A:
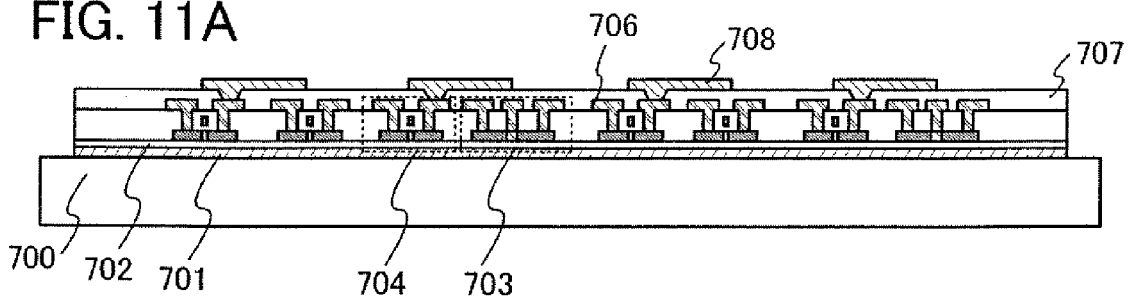
FIGS. 11A to 11E are cross-sectional views illustrating a method of fabricating a semiconductor device in accordance with the invention.

As illustrated in FIG. 11A, a release film 701 is formed over a substrate 700. Next, an insulating film 702 is formed over the release film 701, and the circuit illustrated in FIG. 10 is formed using thin film transistors and the like over the insulating film 702. Although the release film 701 is formed to be in contact with the substrate 700 in FIG. 11A, the invention is not limited to this step. It is also possible to form a base insulating film to be in contact with the substrate 700 and form the release film 701 to be in contact with the base insulating film.

For the substrate 700, a glass substrate made of aluminoborosilicate glass, barium borosilicate glass, quartz, or the like can be used.

The release film 701 is formed by a sputtering method, a plasma CVD method, a coating method, a printing method, or the like using an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material containing such an element as a main component; and/or a compound material containing such an element as a main component, and has a single-layer or a stacked-layer structure. The crystal structure of the release film containing silicon may be any of amorphous, microcrystalline, and polycrystalline.

When the release film 701 has a single-layer structure, it is preferable to form a layer containing tungsten or molybdenum, or a layer containing a mixture of tungsten and molybdenum. Alternatively, a layer containing a tungsten oxide or a tungsten oxynitride, a layer containing a molybdenum oxide or a molybdenum oxynitride, or a layer containing an oxide or an oxynitride of a mixture of tungsten and molybdenum is formed. Note that the mixture of tungsten and molybdenum corresponds to, for example, an alloy of tungsten and molybdenum.

When the release film 701 has a stacked-layer structure, a layer containing tungsten or molybdenum or a layer containing a mixture of tungsten and molybdenum is preferably formed as a first layer, and a layer containing an oxide, a nitride, an oxynitride, or a nitride oxide of tungsten, molybdenum, or a mixture of tungsten and molybdenum is preferably formed as a second layer.

When the release film 701 is formed as a stacked-layer structure of a layer containing tungsten and a layer containing a tungsten oxide, the release film 701 may be formed by the steps of forming a layer containing tungsten and forming an insulating layer containing an oxide thereon so that the layer containing a tungsten oxide is formed at the interface between the tungsten layer and the insulating layer. Alternatively, the layer containing a tungsten oxide may be formed by processing the surface of the layer containing tungsten by using thermal oxidation treatment, oxygen plasma treatment, $N_2O$ plasma treatment, treatment using a solution with strong oxidizing power, such as ozone water, treatment using water to which hydrogen has been added, or the like. This also applies to the case of forming a layer containing a tungsten nitride, a layer containing a tungsten oxynitride, or a layer containing a tungsten nitride oxide. In that case, after forming the layer containing tungsten, a silicon nitride layer, a silicon oxynitride layer, or a silicon nitride oxide layer may be formed on the layer containing tungsten.

A tungsten oxide is represented by $WO_x$, where x satisfies $2 \leq x \leq 3$. The x may be 2 ($WO_2$), 2.5 ($W_2O_5$), 2.75 ($W_4O_{11}$), 3 ($WO_3$), or the like.

Here, the tungsten film is formed by a sputtering method to a thickness of 20 to 100 nm, preferably 40 to 80 nm.

The insulating film 702 can be formed by, for example, generating plasma in the flow of an $N_2O$ gas to form a tungsten oxide film on the surface of the release film 701, and then forming a silicon oxide film containing nitrogen by a plasma CVD method.

FIG. 11A illustrates a Schottky barrier diode 703 and a thin film transistor 704 as typical examples of the circuit in FIG. 10. The method of fabricating the Schottky barrier diode 703 and the thin film transistor 704 is consistent with that of Embodiment 1 or 2. The Schottky barrier diode 703 partly constitutes the rectifier circuit 2021 in FIG. 10.

Next, an insulating film 707 is formed to cover the Schottky barrier diode 703 and the thin film transistor 704. Then, a contact hole is formed in the insulating film 707 to partly expose the conductive film 706 functioning as a source or drain electrode of the thin film transistor 704. A conductive film 708 connected to the conductive film 706 is formed over the insulating film 707.

The insulating film 707 can be formed by the steps of applying polyimide, acrylic, or siloxane polymers and baking them. Alternatively, the insulating film 707 can be formed by a sputtering method, a plasma CVD method, a coating method, a printing method, or the like, using an inorganic compound. The insulating film 707 can have either a single layer or stacked layers. Typical examples of the inorganic compound include silicon oxide, silicon nitride, and silicon oxynitride.

Figure 11B:
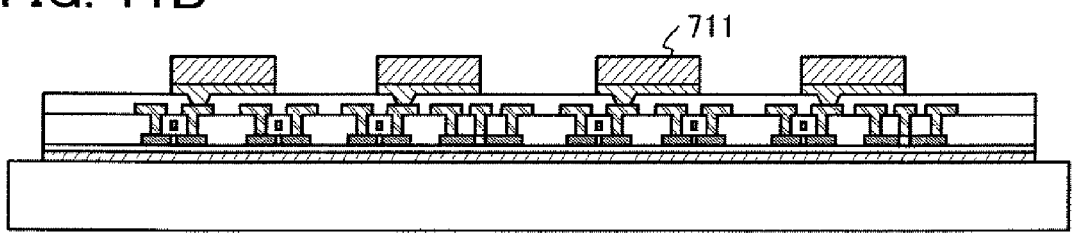

Next, as illustrated in FIG. 11B, a conductive film 711 is formed over the conductive film 708. Here, a composition containing gold particles is printed by a printing method and heated at 200° C. for 30 minutes so that the composition is baked. Thus, the conductive film 711 is formed.

Figure 11C:
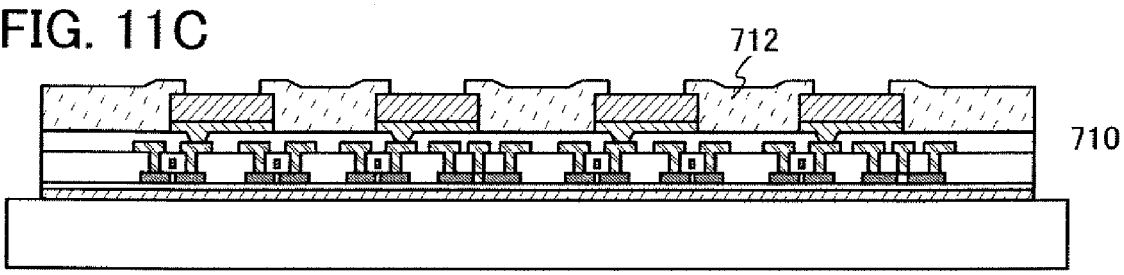

Next, as illustrated in FIG. 11C, an insulating film 712 is formed to cover the insulating film 707 and end portions of the conductive film 711. Here, the insulating film 712 that covers the insulating film 707 and the end portions of the conductive film 711 is formed using an epoxy resin. Specifically, an epoxy resin composition is applied by a spin coating method and heated at 160° C. for 30 minutes. Then, a part of the insulating film which covers the conductive film 711 is removed to expose the conductive film 711. Thus, the insulating film 712 having a thickness of 1 to 20 µm, preferably 5 to 10 µm, is formed. Here, a stack having the insulating film 702 at the bottom and having the insulating film 712 at the top is referred to as an element formation layer 710.

Figure 11D:
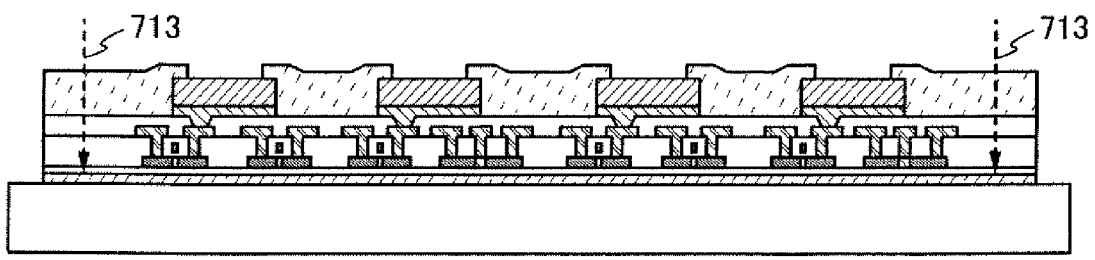
Figure 11E:
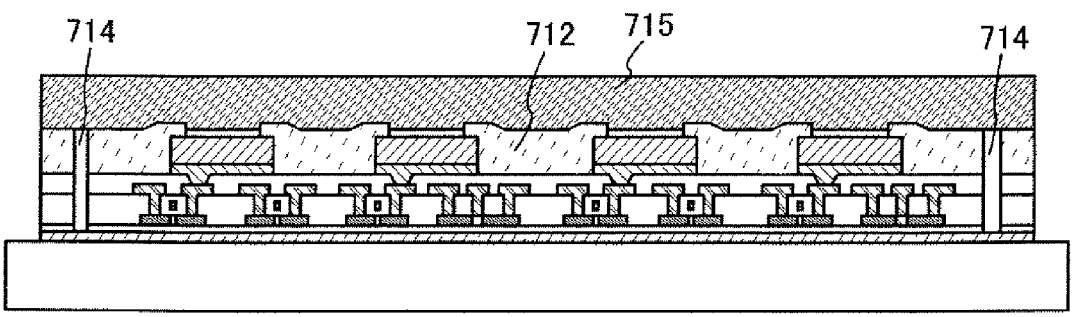

Next, as illustrated in FIG. 11D, the element formation layer 710 is partly irradiated with laser beams 713 to form openings 714 as illustrated in FIG. 11E, in order to facilitate a subsequent step of peeling the element formation layer 710 from the substrate 700. Since a plurality of circuits is formed over the substrate 700, the openings 714 are formed to surround all of the circuits. Next, an adhesive member 715 is attached to the insulating film 712.

Note that if the element formation layer 710 can be easily peeled off the substrate 700 without forming the openings 714, the laser irradiation step can be omitted and throughput can be improved.

Figure 12A:
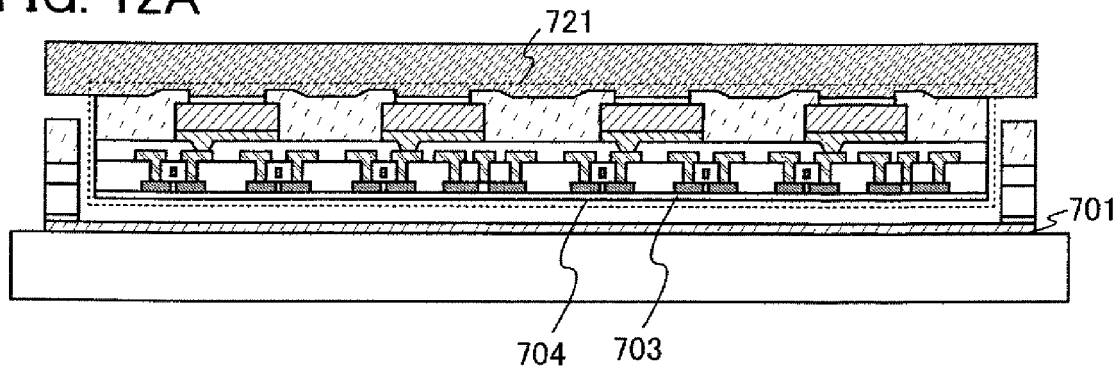
FIGS. 12A to 12D are cross-sectional views illustrating a method of fabricating a semiconductor device in accordance with the invention.

Next, as illustrated in FIG. 12A, a part 721 of the element formation layer 710 is peeled off the substrate 700 by a physical means. A "physical means" here refers to a dynamic means or a mechanical means which changes some kind of dynamic energy (or mechanical energy). A typical physical means refers to the application of mechanical power (for example, pulling by a human hand or a gripping tool, or peeling the element formation layer 710 while rolling a roller thereon).

In this embodiment mode, since a metal oxide film is formed between the release film 701 and the insulating film 702, the interface between the release film 701 and the insulating film 702 has weak adhesion. Thus, peeling can smoothly proceed at the interface. For this reason, a physical means is used to peel the element formation layer 710 from the substrate 700. However, the invention is not limited thereto. A method can be used, in which a light-transmitting substrate is used as the substrate 700 and an amorphous silicon layer containing hydrogen is used as the release film 701. In such a method, after the step in FIG. 11E, the amorphous silicon film is irradiated with a laser beam from the substrate 700 side to vaporize hydrogen contained in the amorphous silicon layer, so that the element formation layer 710 is peeled off the substrate 700.

Further, after the step in FIG. 11E, alternatively, a method of removing the substrate 700 by mechanical polishing, or a method of removing the substrate 700 by using a solution such as HF which dissolves the substrate can be employed. In such a case, it is not necessary to use the release film 701.

Further, a method can be used, in which, before attaching the adhesive member 715 to the insulating film 712 in FIG. 11E, a fluorine compound gas such as $NF_3$, $BrF_3$, or $ClF_3$ is introduced into the openings 714 so that the release film 701 is etched away by the fluorine compound gas; then, the adhesive member 715 is attached to the insulating film 712; and then, the element formation layer 710 is peeled off the substrate 700.

Figure 12B:
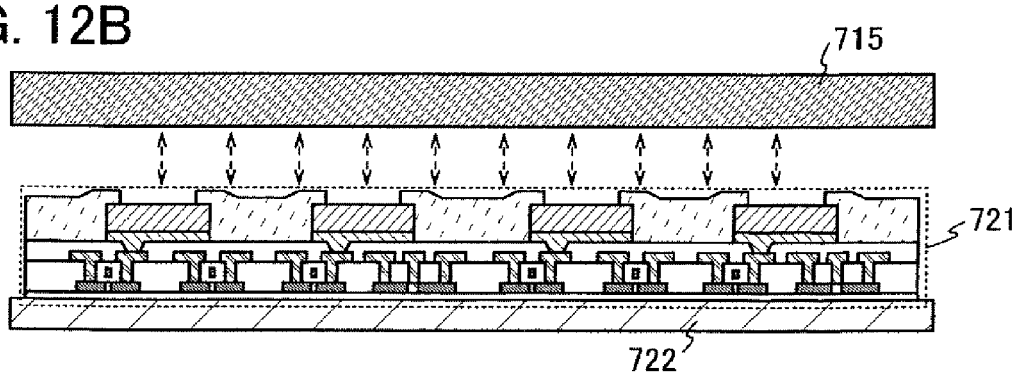

Next, as illustrated in FIG. 12B, a flexible substrate 722 is attached to the insulating film 702 in the part 721 of the element formation layer. Here, a film formed by a cast method using polyaniline is used as the flexible substrate 722. Then, the adhesive member 715 is peeled off the part 721 of the element formation layer.

Figure 12C:
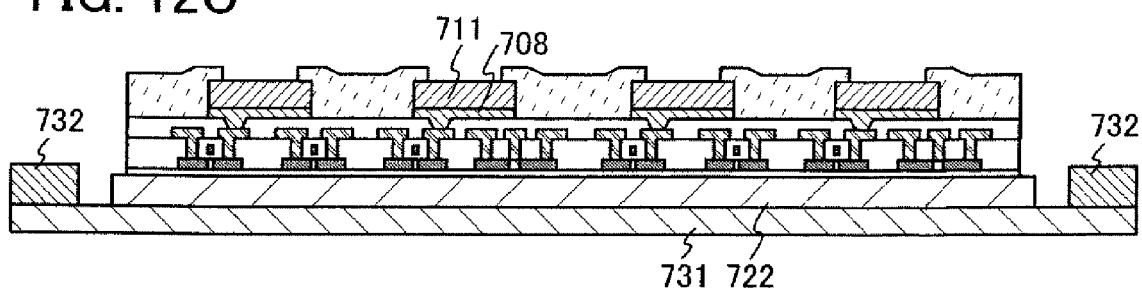

Then, the flexible substrate 722 is attached to a UV sheet 731 of a dicing frame 732, as illustrated in FIG. 12C. Since the UV sheet 731 is adhesive, the flexible substrate 722 is fixed on the UV sheet 731. Then, the conductive film 711 may be irradiated with a laser beam to increase adhesiveness between the conductive film 711 and the conductive film 708.

Figure 12D:
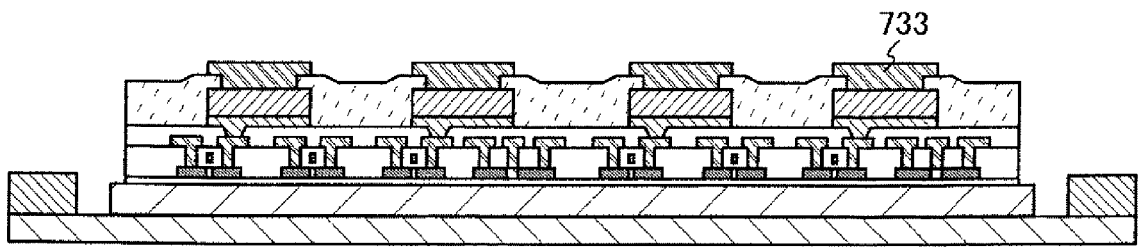

Next, a connection terminal 733 is formed over the conductive film 711, as illustrated in FIG. 12D. The formation of the connection terminal 733 allows the conductive film 711 to be easily aligned with and adhered to a conductive film which subsequently functions as an antenna.

Figure 13A:
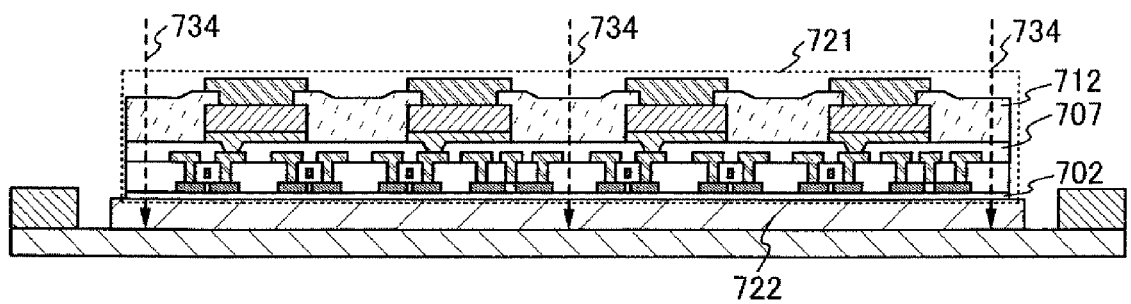
FIGS. 13A to 13C are cross-sectional views illustrating a method of fabricating a semiconductor device in accordance with the invention.
Figure 13B:
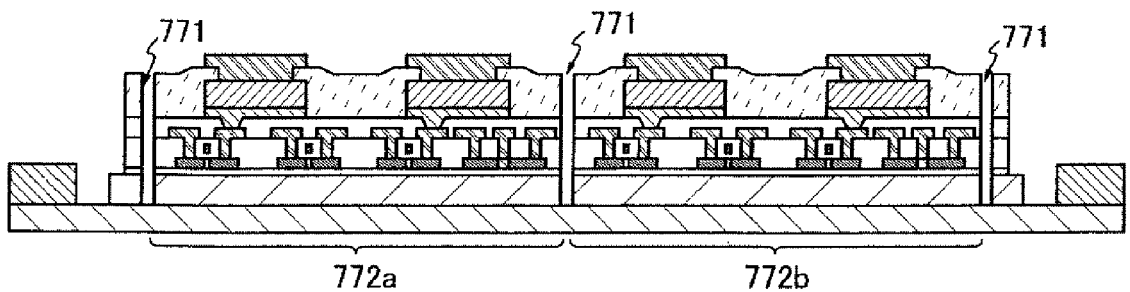
Figure 13C:
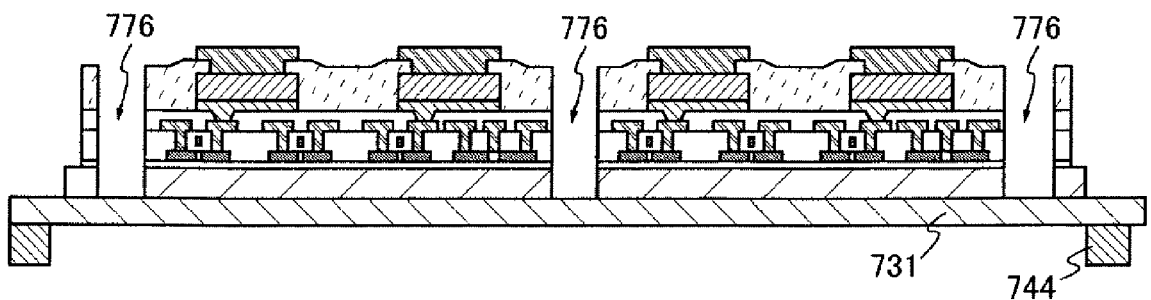

Next, as illustrated in FIG. 13A, the part 721 of the element formation layer is divided into parts. Here, the part 721 of the element formation layer is divided into plural parts as illustrated in FIG. 13B, by irradiating the part 721 of the element formation layer and the flexible substrate 722 with laser beams 734 and forming grooves 771. Although the pan 721 of the element formation layer is divided into plural parts by a laser ablation method here, a dicing method, a scribing method, or the like can be used instead as appropriate. The element formation layer 710 that has been divided into parts is illustrated as thin film integrated circuits 772a and 772b. The power supply section 2002 and the logic section 2003, excluding the antenna section 2001 in FIG. 10 are comprised of the thin film integrated circuits 772a and 772b Next, as illustrated in FIG. 13C, the UV sheet 731 of the dicing frame 732 is irradiated with UV light to decrease the adhesiveness of the UV sheet 731. Then, the UV sheet 731 is supported with an expander frame 744. At this time, by supporting the UV sheet 731 with the expander frame 744 while stretching the UV sheet 731, the width of a groove 771 which is formed between the thin film integrated circuits 772a and 772b can be increased. Note that the width of an expanded groove 776 is preferably determined by taking into account the size of an antenna substrate which is subsequently attached to the thin film integrated circuits 772a and 772b.

Figure 14A:
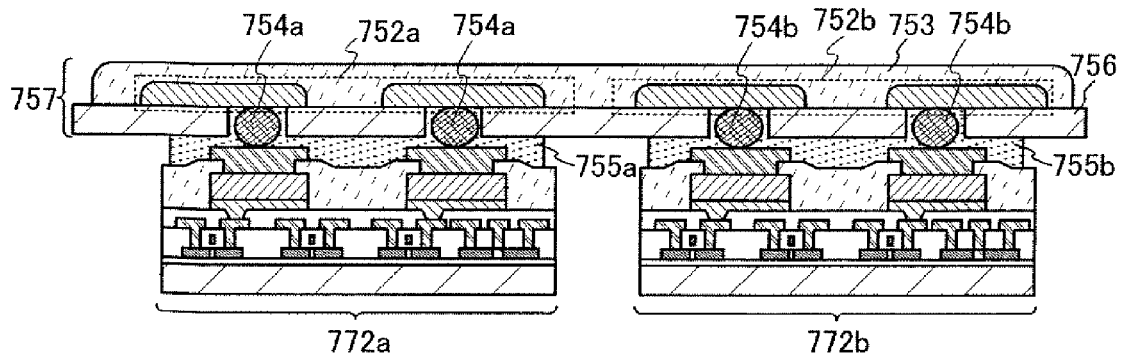
FIGS. 14A to 14D are cross-sectional views illustrating a method of fabricating a semiconductor device in accordance with the invention.

Next, as illustrated in FIG. 14A, an antenna substrate 757, which has a flexible substrate 756 and conductive films 752a and 752b that function as antennas and formed over the flexible substrate 756, is attached to the thin film integrated circuits 772a and 772b using anisotropic conductive adhesives 755a and 755b. Note that the conductive films 752a and 752b are sealed with an insulating film 753. The flexible substrate 756 is provided with openings so as to partly expose the conductive films 752a and 752b.

Here, the conductive film 752a that functions as an antenna is connected to connection terminals of the thin film integrated circuit 772a by conductive particles 754a within the anisotropic conductive adhesive 755a, while the conductive film 752b that functions as an antenna is connected to connection terminals of the thin film integrated circuit 772b by the conductive particles 754b within the anisotropic conductive adhesive 755b.

Figure 14B:
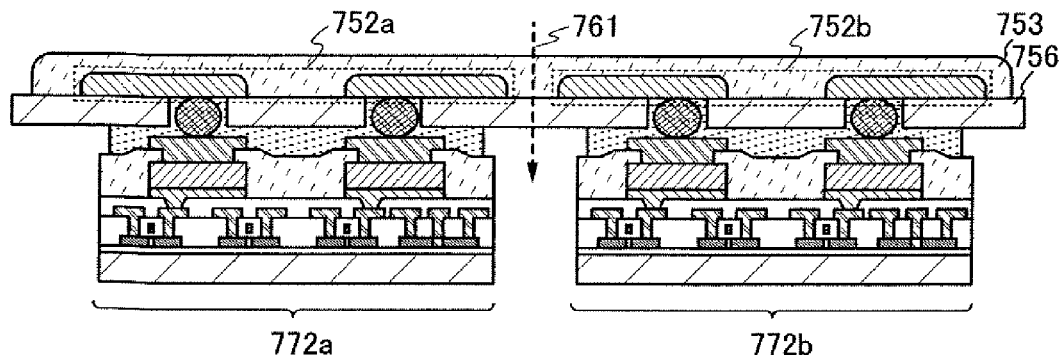

Then, as illustrated in FIG. 14B, the antenna substrate 757 is divided into parts in a region excluding the conductive films 752a and 752b that function as antennas and the thin film integrated circuits 772a and 772b. Here, the antenna substrate 757 is divided into parts by a laser ablation method such that the insulating film 753 and the flexible substrate 756 are irradiated with a laser beam 761.

Figure 14C:
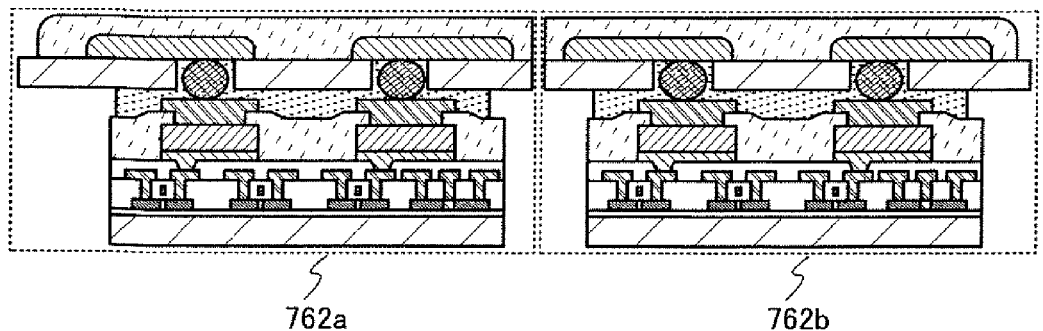

Through the above steps, semiconductor devices 762a and 762b that are capable of wireless data transmission can be fabricated as illustrated in FIG. 14C.

Figure 14D:
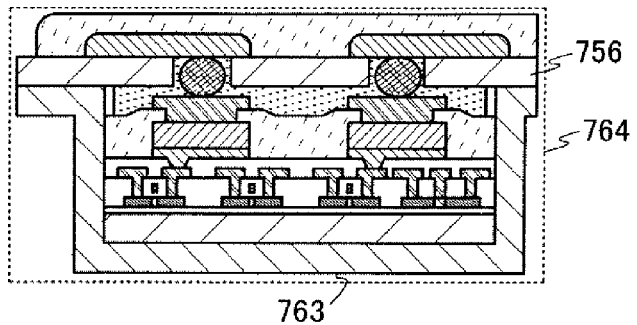
Figure 15A:
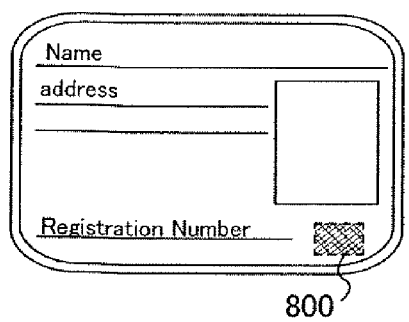
FIGS. 15A to 15F illustrate examples of the application of a semiconductor device of the invention.
Figure 15B:
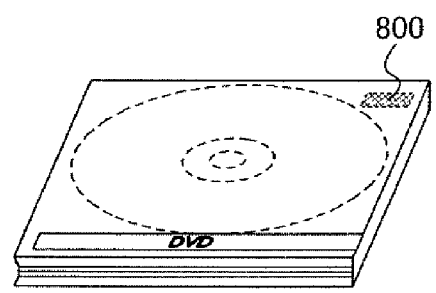
Figure 15C:
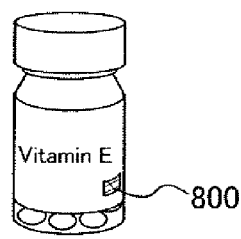
Figure 15D:
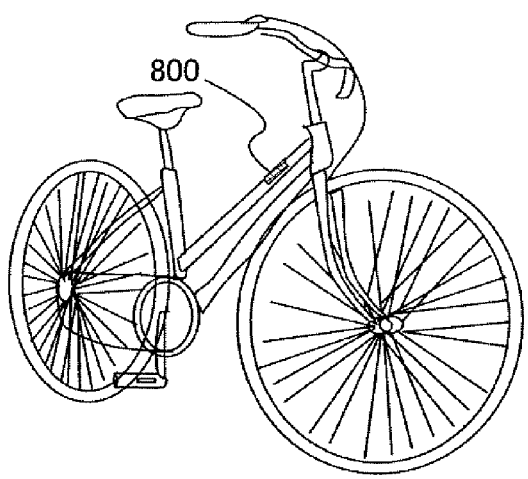
Figure 15E:
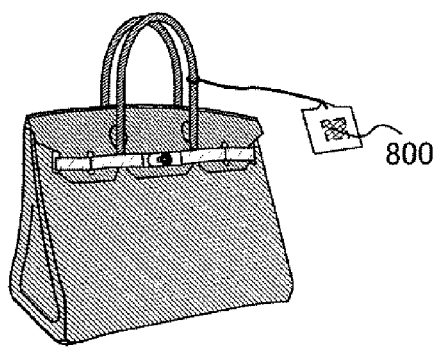
Figure 15F:
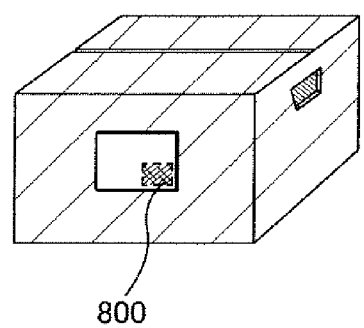

Note that a semiconductor device 764 such as the one illustrated in FIG. 14D may be fabricated in such a way that the flexible substrate 756 having the conductive films 752a and 752b is attached to the thin film integrated circuits 772a and 772b using the anisotropic conductive adhesives 755a and 755b as illustrated in FIG. 14A. Then, another flexible substrate may be provided so as to seal the thin film integrated circuits 772a and 772b with the flexible substrate 756; and the region where the conductive films 752a and 752b that function as antennas and the thin film integrated circuits 772a and 772b are not formed is irradiated with the laser beam 761, as illustrated in FIG. 14D. In this case, the thin film integrated circuits are sealed by the flexible substrates 756 and 763 that have been divided into parts. Therefore, deterioration of the thin film integrated circuits can be suppressed.

Through the steps illustrated in FIGS. 12A to 12D, 13A to 13C, and 14A to 14D, a thin, lightweight, and flexible semiconductor device can be fabricated with a high yield.

Next, examples of the application the semiconductor device of this embodiment that is capable of wireless data transmission will be described, with reference to FIGS. 15A to 15F. Semiconductor devices that are capable of wireless data transmission have a wide range of applications, such as bills, coins, securities, bearer bonds, documents (e.g., driver's licenses or resident's cards; refer to FIG. 15A), packaging containers (e.g. wrapping paper or bottles; refer to FIG. 15C), storage media (e.g., DVD software or video tapes; refer to FIG. 15B), means of transportation (e.g., bicycles; refer to FIG. 15D), personal belongings (e.g., shoes or glasses), food, plants, animals, human bodies, clothing, daily commodities, or tags on goods such as electronic appliances or on bags (refer to FIGS. 15E and 15F). An electronic appliance is, for example, a liquid crystal display device, an EL display device, a television device (also referred to as simply a television, or as a TV receiver or a television receiver), a portable telephone, or the like.

A semiconductor device 800 of this embodiment may be fixed to an article by being mounted on a printed board, attached to a surface of the article, embedded in the article, and so on. For example, if the product is a book, the semiconductor device may be fixed to the book by being embedded inside paper of the book, and if the product is a package made of an organic resin, the semiconductor device may be fixed to the package by being embedded inside the organic resin. Since the semiconductor device 800 of this embodiment can be compact, thin, lightweight, and flexible, the design quality of the article itself is not degraded even after the device is fixed to the article. Further, by providing bills, coins, securities, bearer bonds, documents, and the like with the semiconductor device 800 of this embodiment, they can be provided with an identification function, and forgery can be prevented by making use of the identification function. Moreover, when the semiconductor device of this embodiment is provided in packaging containers, recording media, personal belongings, food, clothes, daily commodities, electronic appliances, and the like, systems such as inspection systems can be made more efficient.

The present application is based on Japanese Priority Application No. 2006-338012 filed on Dec. 15, 2006 with the Japanese Patent Office, the entire contents of which are hereby incorporated by reference.

What is claimed is:

1. A method of manufacturing a semiconductor device, comprising the steps of:
    forming a semiconductor film over a substrate;
    forming a first impurity region by selectively adding a first impurity element to the semiconductor film, the first impurity element having a first conductivity type;
    forming an insulating film over the semiconductor film;
    forming a first opening and a second opening by etching the insulating film;
    forming a mask over the insulating film to cover at least the first opening;
    forming a second impurity region by selectively adding a second impurity element to the semiconductor film through the second opening using the mask, the second impurity element having a second conductivity type opposite to the first conductivity type;
    removing the mask after forming the second impurity region;
    forming a first wiring electrically connected to the first impurity region through the first opening; and
    forming a second wiring electrically connected to the second impurity region through the second opening.

2. The method of manufacturing a semiconductor device according to claim 1, wherein the first conductivity type is n-type conductivity and the second conductivity type is p-type conductivity.

3. The method of manufacturing a semiconductor device according to claim 1, wherein the first conductivity type is p-type conductivity and the second conductivity type is n-type conductivity.

4. The method of manufacturing a semiconductor device according to claim 1, wherein the second impurity region has n-type conductivity, and the second wiring has a work function of 4.4 eV or higher.

5. The method of manufacturing a semiconductor device according to claim 1, wherein the second impurity region has p-type conductivity, and the second wiring has a work function of 4.8 eV or lower.

6. The method of manufacturing a semiconductor device according to claim 1, wherein the second impurity region contains the first impurity element at a first concentration and the second impurity element at a second concentration which is lower than the first concentration.

7. A method of manufacturing a semiconductor device, comprising the steps of:
    forming a first semiconductor film and a second semiconductor film on an insulating surface;
    forming a first insulating film over the first semiconductor film and the second semiconductor film;
    forming a conductive film over the first insulating film;
    etching the conductive film to form a gate electrode over the first semiconductor film with the first insulating film interposed therebetween;
    forming a first impurity region by selectively adding a first impurity element to each of the first semiconductor film and the second semiconductor film, the first impurity element having a first conductivity type;
    forming a second insulating film over the first semiconductor film and the second semiconductor film;
    forming a first opening, a second opening, and a third opening by etching the first insulating film and the second insulating film;
    forming a mask to cover at least the first opening and the third opening;

forming a second impurity region by selectively adding a second impurity element to the second semiconductor film through the second opening using the mask, the second impurity element having a second conductivity type opposite to the first conductivity type;

removing the mask after forming the second impurity region;

forming a first wiring electrically connected to the first impurity region in the first semiconductor film through the first opening;

forming a second wiring electrically connected to the second impurity region in the second semiconductor film through the second opening; and forming a third wiring electrically connected to the first impurity region in the second semiconductor film through the third opening.

8. The method of manufacturing a semiconductor device according to claim 7, wherein the first conductivity type is n-type conductivity and the second conductivity type is p-type conductivity.

9. The method of manufacturing a semiconductor device according to claim 7, wherein the first conductivity type is p-type conductivity and the second conductivity type is n-type conductivity.

10. The method of manufacturing a semiconductor device according to claim 7, wherein the second impurity region has n-type conductivity, and the second wiring has a work function of 4.4 eV or higher.

11. The method of manufacturing a semiconductor device according to claim 7, wherein the second impurity region has p-type conductivity, and the second wiring has a work function of 4.8 eV or lower.

12. The method of manufacturing a semiconductor device according to claim 7, wherein the second impurity region contains the first impurity element at a first concentration and the second impurity element at a second concentration which is lower than the first concentration.

* * * * *